(12) United States Patent
Tuncer

(10) Patent No.: US 11,594,474 B2
(45) Date of Patent: Feb. 28, 2023

(54) BONDWIRE PROTRUSIONS ON CONDUCTIVE MEMBERS

(71) Applicant: TEXAS INSTRUMENTS INCORPORATED, Dallas, TX (US)

(72) Inventor: Enis Tuncer, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 6 days.

(21) Appl. No.: 17/246,568

(22) Filed: Apr. 30, 2021

(65) Prior Publication Data

US 2022/0352054 A1 Nov. 3, 2022

(51) Int. Cl.
| H01L 23/495 | (2006.01) |
| H01L 23/00 | (2006.01) |
| H01L 23/31 | (2006.01) |
| H01L 21/48 | (2006.01) |
| H01L 21/56 | (2006.01) |

(52) U.S. Cl.
CPC ...... *H01L 23/4952* (2013.01); *H01L 21/4825* (2013.01); *H01L 21/565* (2013.01); *H01L 23/3114* (2013.01); *H01L 23/3142* (2013.01); *H01L 24/32* (2013.01); *H01L 24/48* (2013.01); *H01L 24/73* (2013.01); *H01L 24/85* (2013.01); *H01L 2224/32245* (2013.01); *H01L 2224/48175* (2013.01); *H01L 2224/73265* (2013.01)

(58) Field of Classification Search
CPC .................................................... H01L 23/495
See application file for complete search history.

(56) References Cited

U.S. PATENT DOCUMENTS

| 10,211,131 B1* | 2/2019 | Kitnarong | H01L 23/3142 |
| 2010/0283142 A1* | 11/2010 | Feng | H01L 23/3107 |
| | | | 438/122 |
| 2017/0194170 A1* | 7/2017 | Lin | H01L 23/49513 |
| 2019/0371710 A1* | 12/2019 | Urushihata | H01L 23/53233 |

* cited by examiner

*Primary Examiner* — Yu-Hsi D Sun
(74) *Attorney, Agent, or Firm* — Jacqueline J. Garner; Frank D. Cimino

(57) ABSTRACT

In some examples, a semiconductor package comprises a semiconductor die; a conductive member coupled to the semiconductor die; and a wirebonded protrusion coupled to the conductive member. A physical structure of the wirebonded protrusion is determined at least in part by a sequence of movements of a wirebonding capillary used to form the wirebonded protrusion, the wirebonded protrusion including a ball bond and a bond wire, and the bond wire having a proximal end coupled to the ball bond. The bond wire has a distal end. The package also comprises a mold compound covering the semiconductor die, the conductive member, and the wirebonded protrusion. The distal end is in a common vertical plane with the ball bond and is not connected to a structure other than the mold compound.

21 Claims, 21 Drawing Sheets

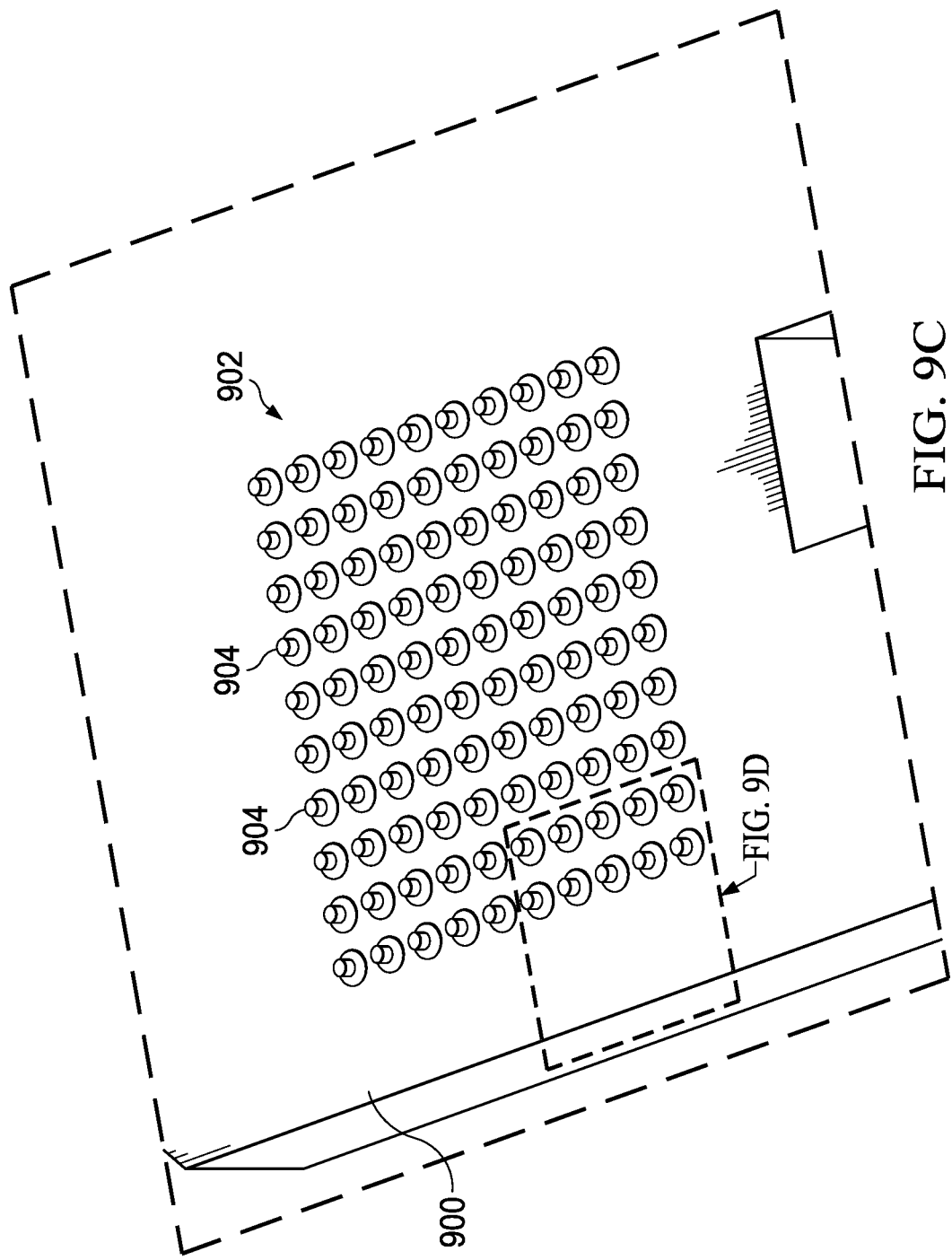

BONDWIRE PROTRUSIONS ON CONDUCTIVE MEMBERS

BACKGROUND

Semiconductor chips are housed inside packages that protect the chips from deleterious environmental influences, such as heat, moisture, and debris. A packaged chip communicates with electronic devices outside the package via conductive members (e.g., leads) that are exposed to surfaces of the package. Within the package, the chip may be electrically coupled to the conductive members using any suitable technique. One such technique is wire bonding, in which one end of a conductive wire (also called a bond wire) is coupled to a conductive member and the other end of the wire is coupled to the chip. Flip chip configurations are also useful, in which the semiconductor die is flipped upside down so the device side of the semiconductor die faces downward. In such configurations, the device side of the semiconductor die may be coupled to conductive members using solder bumps.

SUMMARY

In some examples, a semiconductor package comprises a semiconductor die; a conductive member coupled to the semiconductor die; and a wirebonded protrusion coupled to the conductive member. A physical structure of the wirebonded protrusion is determined at least in part by a sequence of movements of a wirebonding capillary used to form the wirebonded protrusion, the wirebonded protrusion including a ball bond and a bond wire, and the bond wire having a proximal end coupled to the ball bond. The bond wire has a distal end. The package also comprises a mold compound covering the semiconductor die, the conductive member, and the wirebonded protrusion. The distal end is in a common vertical plane with the ball bond and is not connected to a structure other than the mold compound.

In some examples, a method includes using a wirebonding capillary to form a first wirebonded member on a conductive member, and moving the wirebonding capillary through a sequence of movements to emit a bond wire and to cause the bond wire to form a second wirebonded member on top of the first wirebonded member. The second wirebonded member includes a proximal end coupled to the first wirebonded member. The method also includes moving the wirebonding capillary upward to cut the bond wire and to form a distal end of the second wirebonded member, the distal end sharing a common vertical plane with the first wirebonded member. The method also includes coupling a semiconductor die to the conductive member and covering the semiconductor die, the first wirebonded member, and the second wirebonded member with a mold compound. The distal end does not abut a structure other than the mold compound.

BRIEF DESCRIPTION OF THE DRAWINGS

For a detailed description of various examples, reference will now be made to the accompanying drawings in which.

DETAILED DESCRIPTION

Semiconductor packages include mold compound layers that protect the semiconductor die from deleterious environmental influences. The mold compound layer may be applied using a mold injection technique, for example, and then the mold compound may be cured. After the passage of time, the mold compound layer may undesirably separate from components inside the package, such as from a conductive member. Similarly, other materials within the package, such as a die attach layer, may undesirably separate from a conductive member. Such separation is called delamination. Delamination may lead to accelerated moisture absorption, device malfunction, parametric shifts, broken ball bonds, and other challenges.

This disclosure describes various examples of a semiconductor package having bondwire protrusions on conductive members to prevent mold compound delamination and die attach layer delamination. The bondwire protrusions increase the overall surface area to which the mold compound and/or die attach layer bond, thus increasing the adhesion strength between the conductive member and the mold compound and/or die attach layer and mitigating the risk of delamination. In examples, a wirebonding capillary is used to form bondwire protrusions on conductive members. The wirebonding capillary may be moved in specific movement patterns when forming the bondwire protrusions so the bondwire protrusions have particular shapes that may further reduce the risk of delamination. For example, bondwire protrusions may include loops, hooks, and other such shapes to increase adhesion between the conductive member and the mold compound and/or die attach layer. The bondwire protrusions described herein are superior to other techniques that mitigate delamination risk because they may be easily applied to virtually all types of conductive members without significantly altering the semiconductor package manufacturing process flow and without significantly increasing expense.

Figure 1A:
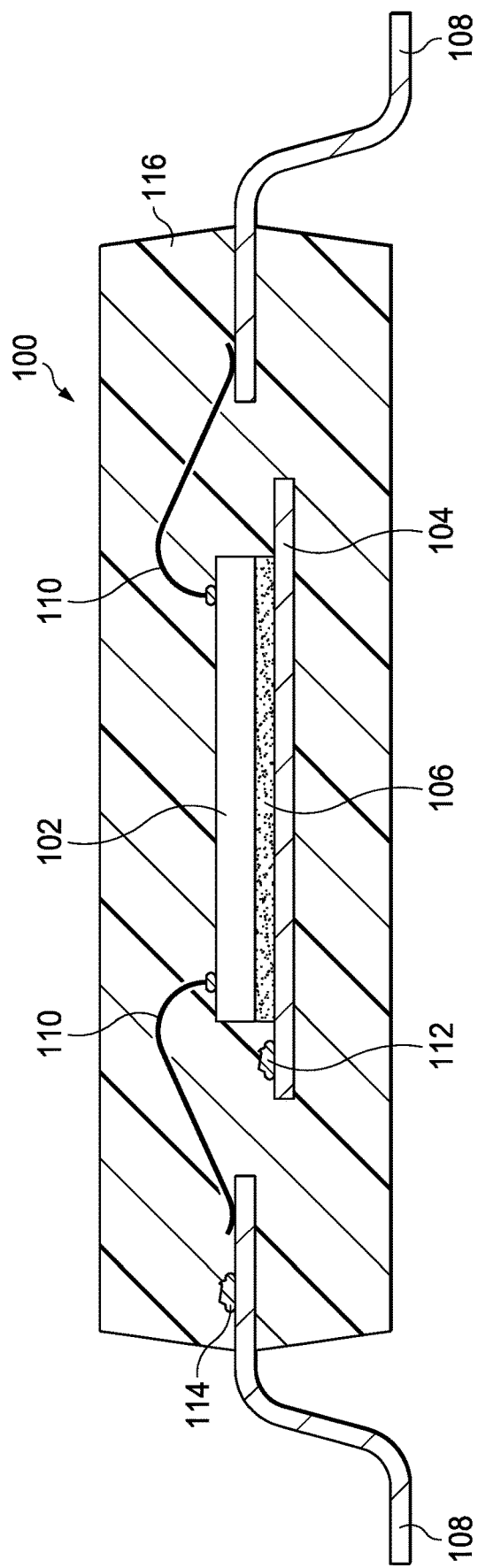
FIG. 1A is a profile cross-sectional view of a semiconductor package having wirebonded protrusions coupled to conductive members, in accordance with various examples.

FIG. 1A is a profile cross-sectional view of a semiconductor package 100 having wirebonded protrusions coupled to conductive members, in accordance with various examples. Notwithstanding the particular manner in which FIG. 1A depicts the semiconductor package 100, the semiconductor package 100 may be any suitable type of package, such as a dual inline package (DIP), a quad flat no-lead (QFN) package, a package having gullwing style leads, a flip-chip style package, a ball grid array (BGA) package, a combination of one or more such package types, etc. In examples, the semiconductor package 100 includes a mold compound, die attach layer, or other material that is conventionally susceptible to delamination. The semiconductor package 100 includes a semiconductor die 102, such as a silicon die. The semiconductor die 102 has an upward-facing device side in and/or on which circuitry may be formed. The semiconductor die 102 also has a downward-facing non-device side that is opposite the device side. The semiconductor die 102 is coupled to a conductive member 104 (e.g., a die pad) by way of a die attach layer 106. Conductive members 108 are exposed to an exterior of the semiconductor package 100, and they are coupled to the device side of the semiconductor die 102 by way of bond wires 110. The semiconductor package 100 includes multiple wirebonded protrusions 112, 114. A mold compound 116 covers the components of FIG. 1A described above.

The wirebonded protrusions 112, 114 increase the available surface area to which the mold compound 116 may couple, thus increasing the adhesive strength between the mold compound 116 and the surface(s) on which the wirebonded protrusions 112, 114 are mounted and mitigating delamination risk. The example wirebonded protrusion 112 is coupled to one of the conductive members 108, as shown. The example wirebonded protrusion 114 is coupled to the conductive member 104, as shown. Although two wirebonded protrusions 112, 114 are shown, any number of wirebonded protrusions may be included. In examples, dozens of wirebonded protrusions may be included. In examples, hundreds of wirebonded protrusions may be included, and in examples, thousands (or more) of wirebonded protrusions may be included. For simplicity and convenience, only the wirebonded protrusions 112, 114 are described with reference to FIG. 1A, but the description of the wirebonded protrusions 112, 114 may also apply to other wirebonded protrusions included in the semiconductor package 100.

The wirebonded protrusions 112, 114 may be formed using a wirebonding capillary. Specifically, a wirebonding capillary may be moved according to a target movement pattern, thereby forming a wirebonded protrusion 112, 114. Various shapes and sizes of the wirebonded protrusions 112, 114 may be formed by moving the wirebonding capillary in the appropriate movement patterns. For example, the wirebonded protrusions 112, 114 may have a hook shape, a loop shape, a rod shape, etc. Some wirebonded protrusions 112, 114 may provide additional adhesive strength by increasing surface area and by providing a shape, such as a hook or a loop, that is useful to hold (or "lock") the mold compound in place. At least some example shapes and example wirebonding capillary movement patterns useful to form wirebonded protrusions having such shapes are described in detail below.

The wirebonded protrusions 112, 114 are not conventional wirebonds that couple the device side of a semiconductor die to a conductive member (e.g., lead). For instance, the wirebonded protrusions 112, 114 are not the bond wires 110. Rather, the wirebonded protrusions 112, 114 leverage the fact that wirebonding capillaries may be easily used during most stages of the semiconductor package manufacturing process to form wirebonded protrusions 112, 114 that are mounted on a single surface, such as on the conductive member 108 or the conductive member 104 in FIG. 1A. The formation of these wirebonded protrusions 112, 114 entails moving the wirebonding capillary in a movement pattern that causes the bond wire emitted by the wirebonding capillary to be folded onto itself in various patterns, thereby forming various shapes of various sizes. As mentioned above, some such shapes are described below. The specific appearance of the example wirebonded protrusions 112, 114 in FIGS. 1A-1C (and the appearances of the example wirebonded protrusions in FIGS. 2A-2C) are genericized to represent a wide array of possible shapes and sizes.

Figure 1B:
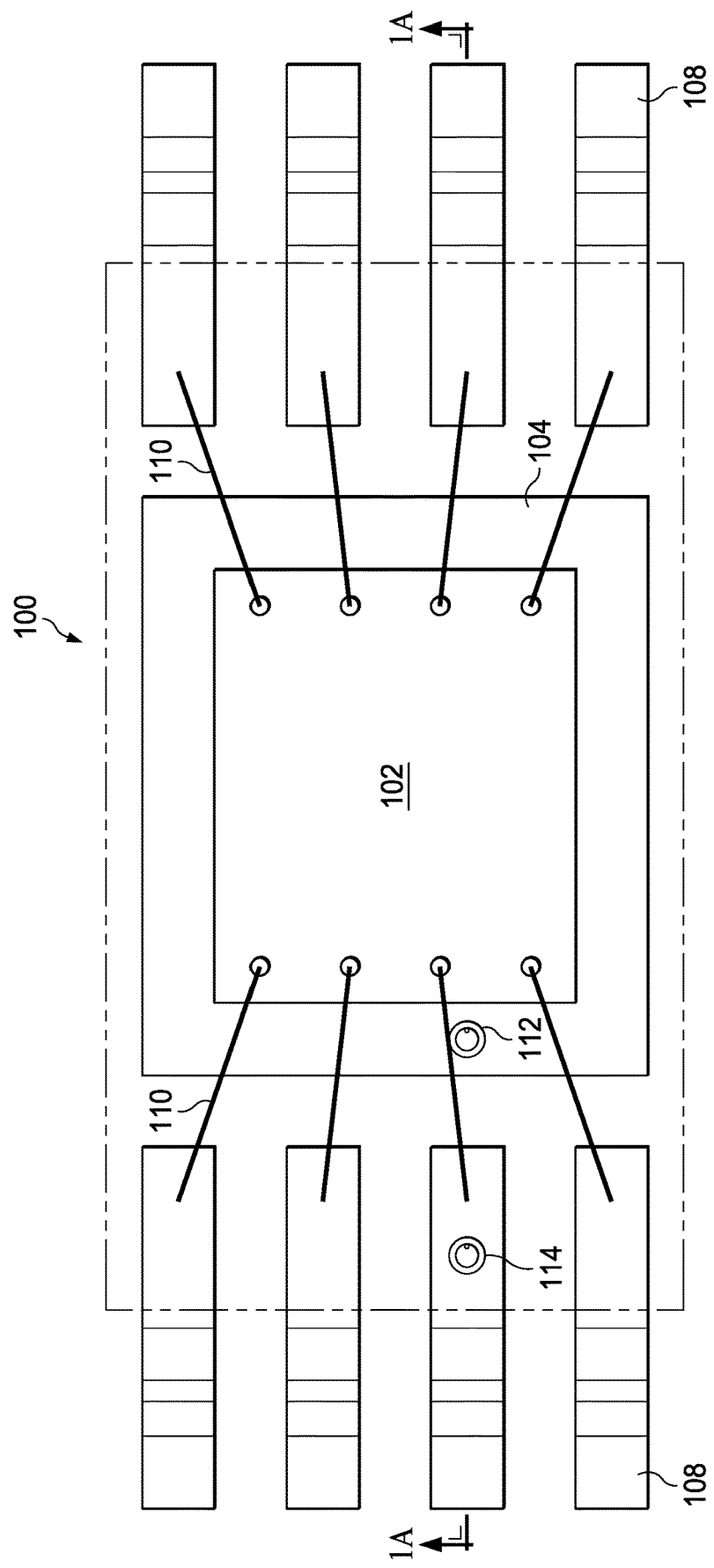
FIG. 1B is a top-down view of a semiconductor package having wirebonded protrusions coupled to conductive members, in accordance with various examples.
Figure 1C:
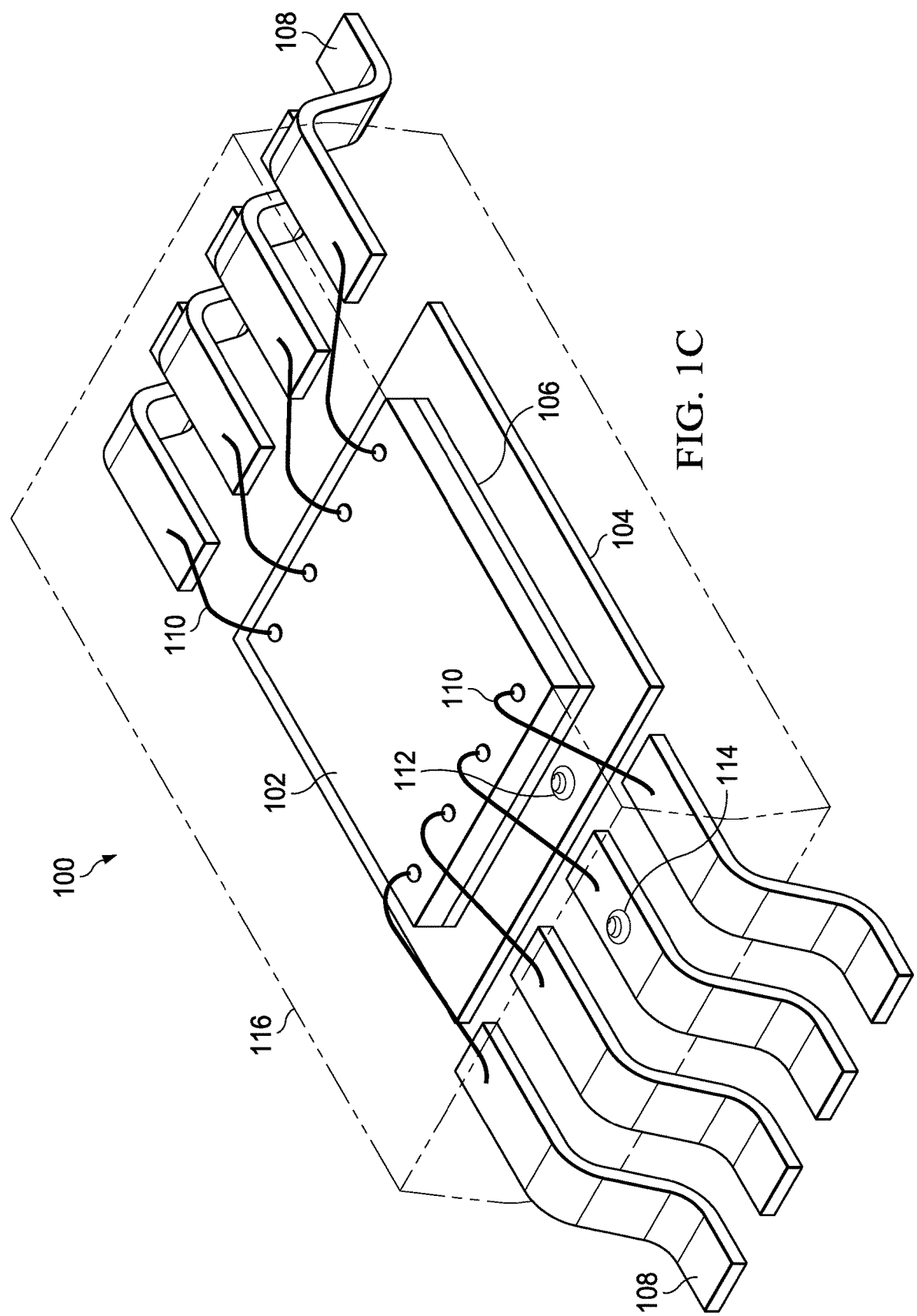
FIG. 1C is a perspective view of a semiconductor package having wirebonded protrusions coupled to conductive members, in accordance with various examples.

FIG. 1B is a top-down view of the semiconductor package 100, in accordance with various examples. FIG. 1C is a perspective view of the semiconductor package 100, in accordance with various examples.

Figure 2A:
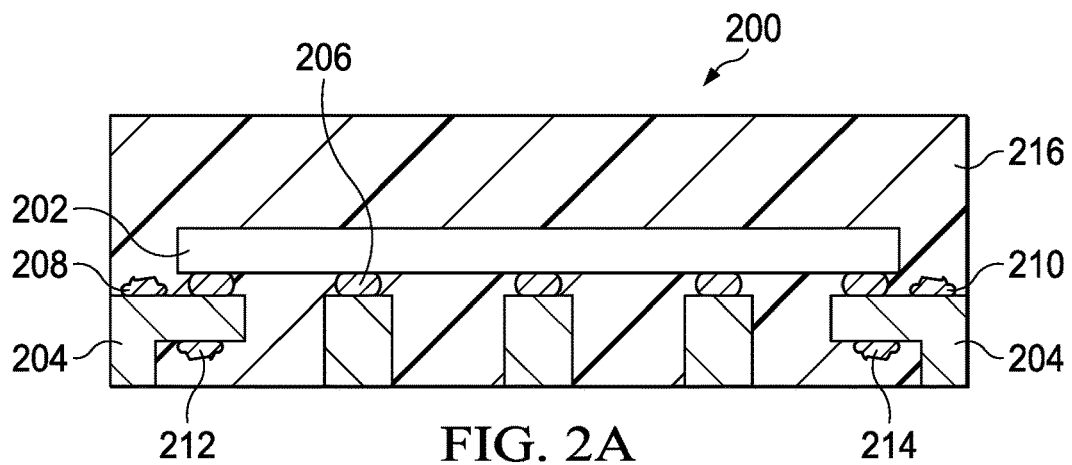
FIG. 2A is a profile cross-sectional view of a flip-chip semiconductor package having wirebonded protrusions coupled to conductive members, in accordance with various examples.

FIG. 2A is a profile cross-sectional view of a flip-chip semiconductor package 200 having wirebonded protrusions coupled to conductive members, in accordance with various examples. Specifically, the example semiconductor package 200 may be a QFN package including a semiconductor die 202 in a flip-chip configuration, meaning that the device side of the semiconductor die 202 faces downward, and the non-device side of the semiconductor die 202 faces upward. The semiconductor package 200 includes conductive members 204 that are exposed to an exterior of the semiconductor package 200. The device side of the semiconductor die 202 may be coupled to the conductive members 204 by way of balls 206 (e.g., solder balls). The semiconductor package 200 includes example wirebonded protrusions 208, 210, 212, and 214, as shown. The description provided above for the wirebonded protrusions 112, 114 (FIG. 1A) and that is provided elsewhere herein for wirebonded protrusions more generally applies to the wirebonded protrusions 208, 210, 212, and 214. As shown, some wirebonded protrusions may be formed on top surfaces of conductive members 204, as is the case for the wirebonded protrusions 208 and 210. In examples, some wirebonded protrusions may be formed on bottom surfaces of conductive members 204, such as in half-etched portions of conductive members 204, as is the case for wirebonded protrusions 212 and 214. Although four wirebonded protrusions are shown in FIG. 2A, any number of wirebonded protrusions may be used. A mold compound 216 covers the structures described above. The description provided above for the wirebonded protrusions 112, 114 also applies to the wirebonded protrusions 208, 210, 212, and 214.

Figure 2B:
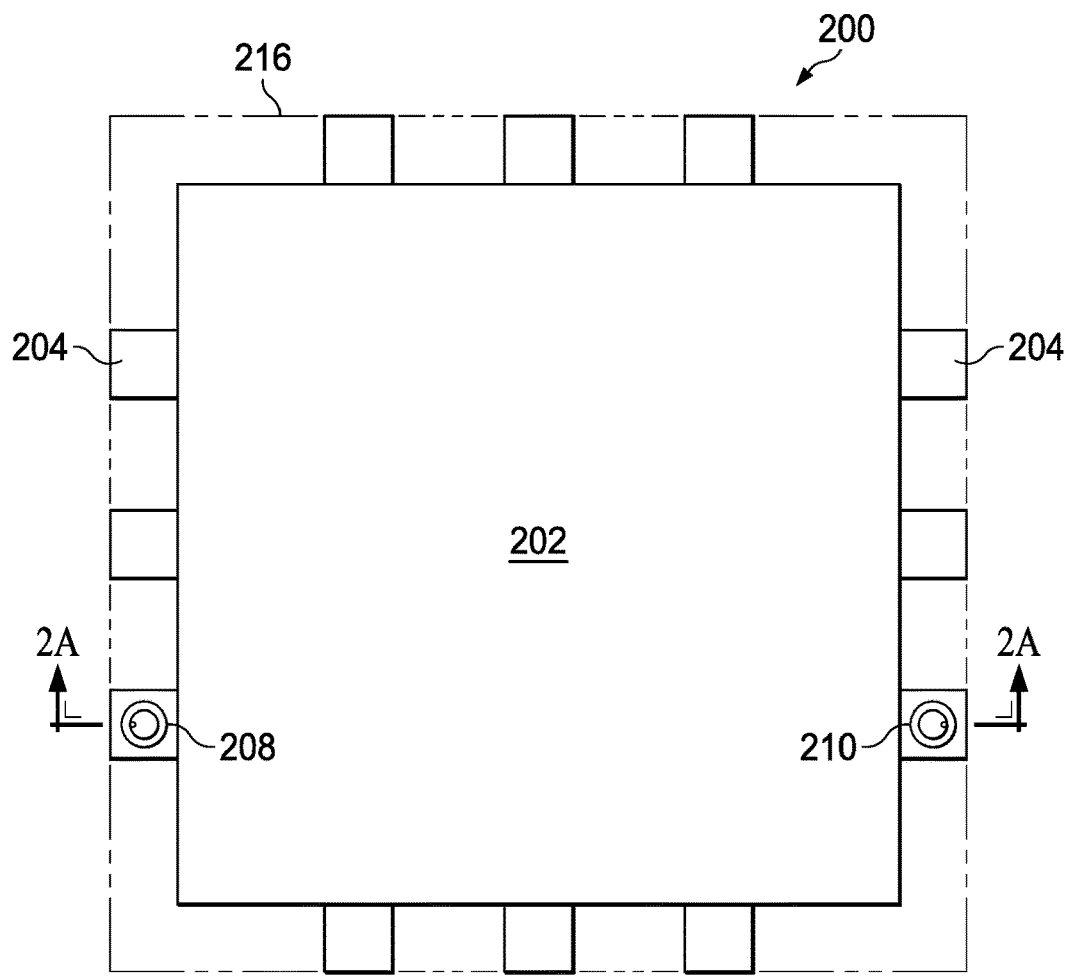
FIG. 2B is a top-down view of a flip-chip semiconductor package having wirebonded protrusions coupled to conductive members, in accordance with various examples.
Figure 2C:
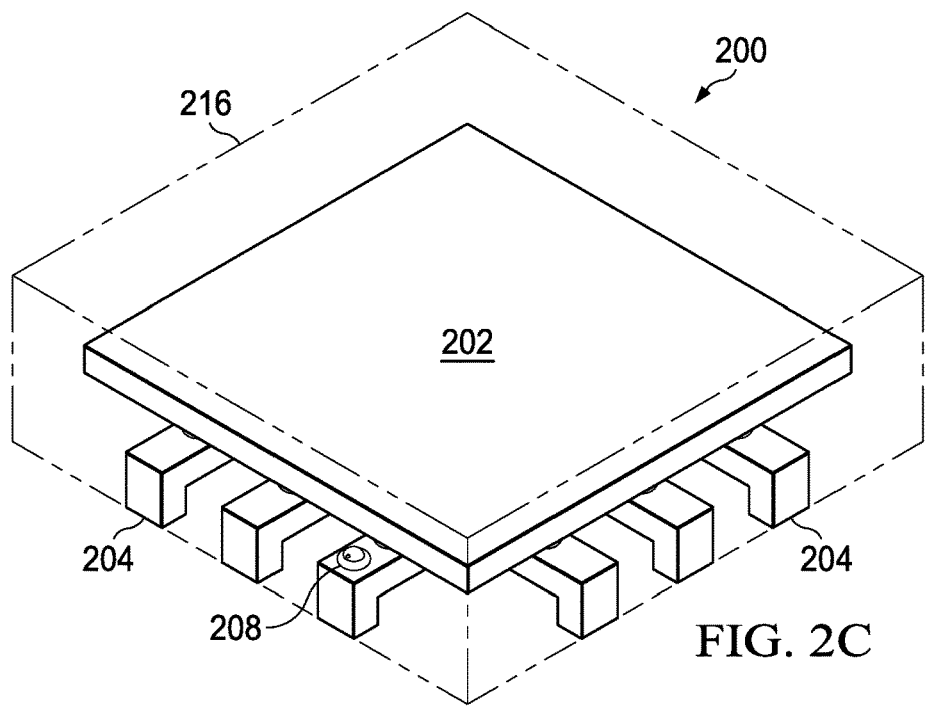
FIG. 2C is a perspective view of a flip-chip semiconductor package having wirebonded protrusions coupled to conductive members, in accordance with various examples.

FIG. 2B is a top-down view of the flip-chip semiconductor package 200, in accordance with various examples. FIG. 2C is a perspective view of the flip-chip semiconductor package 200, in accordance with various examples.

Example shapes of wirebonded protrusions are now described with reference to FIGS. 3A-7E. As described above, wirebonded protrusions are formed by moving a wirebonding capillary in a specific target movement pattern. Thus, for each shape described below, an accompanying wirebonding capillary movement pattern useful to form the shape is described. The scope of this disclosure is not limited to the specific wirebonded protrusion shapes described herein, and particular shapes may be formed using more than one wirebonding capillary movement pattern. All such variations are contemplated and included in the scope of this disclosure.

Figure 3A:
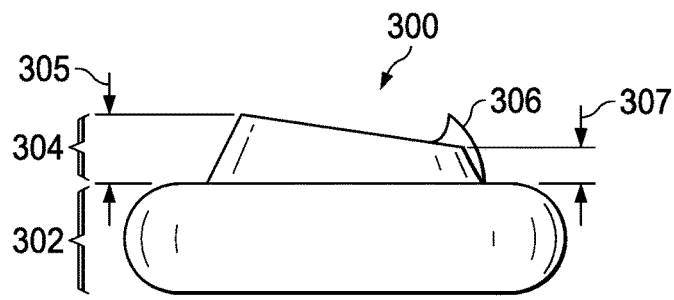
FIGS. 3A-3C are profile cross-sectional, top-down, and perspective views of a wirebonded protrusion coupled to a conductive member, in accordance with various examples.

FIG. 3A is a profile cross-sectional view of a wirebonded protrusion 300, in accordance with various examples. The wirebonded protrusion 300 includes a bottom portion 302, a top portion 304, and a tapered portion (or "tail") 306 that is part of the top portion 304. In examples, the bottom portion 302 is known as a ball bond. In examples, the tapered portion 306 and the bottom portion 302 share a common vertical plane. In some examples, the wirebonded protrusion 300 is formed using bond wire emitted by a wirebonding capillary as the capillary is being moved according to a target movement pattern. As the wirebonding capillary is being moved according to the target movement pattern, wire clamps associated with the wirebonding capillary may be opened and closed at specific points in the movement pattern to manipulate the bond wire and to affect the shape of the wirebonded protrusion 300 being formed. In examples, the bond wire used to form the wirebonded protrusion 300 is formed of copper, although other metals and/or metal alloys may be useful. In at least some examples, the wirebonded protrusion 300 is formed of a material that is different from the material on which it is mounted. For example, some conductive members (e.g., leads, die pads) are plated with a nickel palladium gold alloy, and thus the wirebonded protrusion 300 may be formed of a different material, such as copper.

The bond wire has a gauge ranging from 0.2 mils to 2 mils, with wire gauges outside this range being disadvantageous because an excessive package size would result. Adjacent wirebonded protrusions 300 have a pitch between them ranging from 15 microns to 200 microns, with pitches outside this range being disadvantageous because they provide inadequate increases in surface area or they become difficult or impossible to implement from a process perspective. The pitch between adjacent wirebonded protrusions is at least three times the bond wire gauge used to form the wirebonded protrusions. A multiplier smaller than three is disadvantageous because it can become difficult or impossible to implement from a process perspective.

Figure 3B:
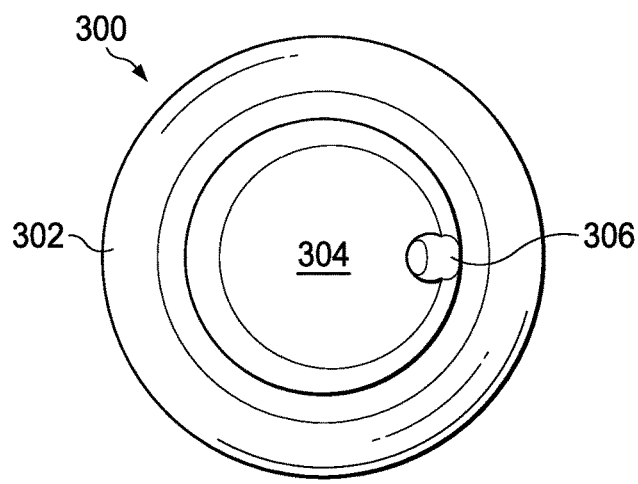
Figure 3C:
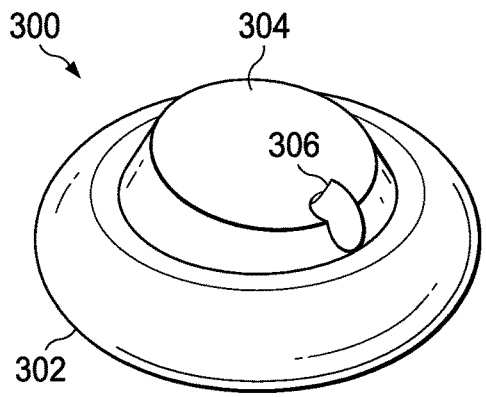

FIG. 3B is a top-down view of the wirebonded protrusion 300, in accordance with various examples. FIG. 3C is a perspective view of the wirebonded protrusion 300, in accordance with various examples.

Figure 3D:
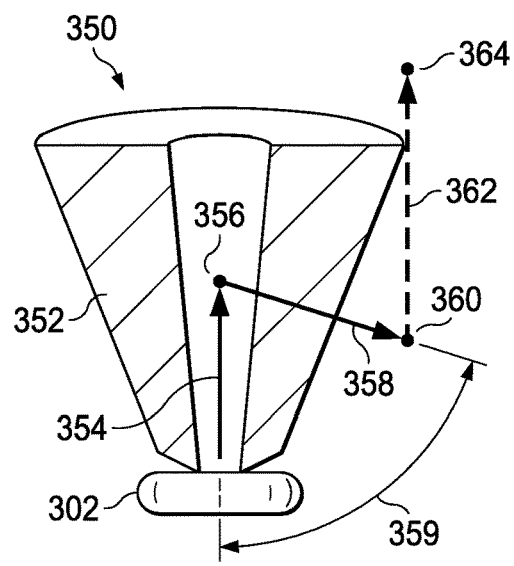
FIG. 3D is a diagram of a wirebonding capillary movement pattern in accordance with various examples.
Figure 3E:
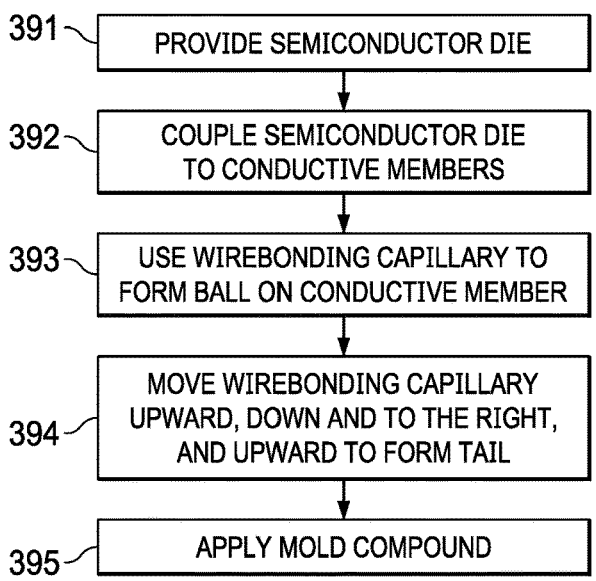
FIG. 3E is a flow diagram of a method for manufacturing a semiconductor package including a wirebonded protrusion coupled to a conductive member, in accordance with various examples.

FIG. 3D is a diagram 350 of a wirebonding capillary movement pattern in accordance with various examples. FIG. 3E is a flow diagram of a method 390 for manufacturing a semiconductor package including the wirebonded protrusion 300, in accordance with various examples. FIGS. 3D and 3E are now described in parallel. The method 390 begins with providing a semiconductor die (391). The method 390 includes coupling the semiconductor die to one or more conductive members (392). For example, the semiconductor die may be flipped and coupled to conductive members using solder balls. Alternatively, a wirebonding technique may be used. The method 390 then includes using a wirebonding capillary to form the bottom portion 302 on a conductive member (393). For example, the bottom portion 302 may be a ball bond. In examples, the bottom portion 302 is formed by using an electronic flame off (EFO) technique to form a ball, and subsequently applying the ball to the conductive member using ultrasound, mechanical force at a normal angle, and heat to form a ball bond. The bottom portion 302 has horizontal dimensions ranging from the wire diameter to four times the wire diameter, with dimensions outside of this range being disadvantageous because the pitch would be larger for a large footprint of bottom portion 302, and the strength of the bond between the wire and the conductive member will be weak if the footprint is small. Other bottom portions described herein may have similar dimensions. The diagram 350 of FIG. 3D depicts the bottom portion 302 formed using a wirebonding capillary 352.

The method 390 then includes moving the wirebonding capillary 352 upward (394), as numeral 354 indicates in the diagram 350. In examples, the wirebonding capillary 352 is moved upward to point 356. The total distance of upward movement 354 to point 356 determines a maximum height 305 of the top portion 304 (FIG. 3A). This maximum height 305 ranges from half of the wire diameter to the wire diameter, with heights outside of this range being disadvantageous because the force required to cut the wire would be too high or too low to properly control the height. Thus, the total distance of upward movement 354 should be in a range that produces a height in the range provided above.

The method 390 then includes moving the wirebonding capillary 352 downward and to the right (394), as numeral 358 indicates in FIG. 3D. An angle 359 between the upward movement 354 and the movement 358 may range from 15 to 75 degrees, with angles outside this range being disadvantageous because they would be impractical from a process perspective to form the structure. The angle 359 determines the shape and the height of the top portion 304. The total distance of movement 358 to point 360 determines height 307 shown in FIG. 3A. The height 307 ranges from 0 microns to the wire diameter, with heights greater than this range leading to a protrusion on the opposite end of the starting point.

The method 390 then includes moving the wirebonding capillary 352 upward to cut the bond wire and to form the tapered portion (or "tail") 306 (FIG. 3A) (394). In FIG. 3D, numeral 362 indicates this upward movement, which terminates at point 364. The total distance of the upward movement 362 determines the height of the tapered portion 306. The height of the tapered portion 306 ranges from 0 microns to the wire diameter, with values larger than this range inadvertently and undesirably leading to a wire column design. Upward movements 354 and 362 may be at a normal angle relative to the surface on which the bottom portion 302 is formed. The method 390 includes applying a mold compound (395). The steps 393 and 394 may be performed at any time in the method 390, as long as the surface on which the wirebonded protrusion 300 is to be formed is accessible by the wirebonding capillary 352 without obstruction.

Figure 4A:
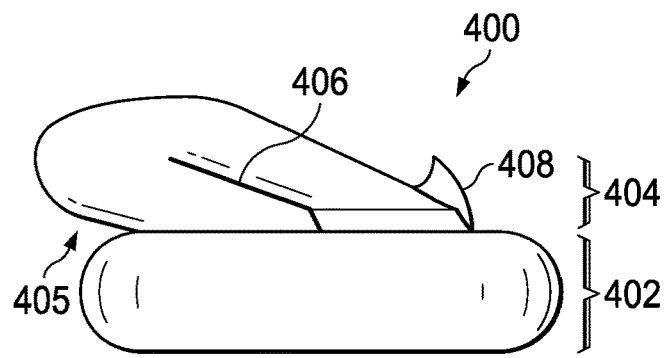
FIGS. 4A-4C are profile cross-sectional, top-down, and perspective views of a wirebonded protrusion coupled to a conductive member, in accordance with various examples.

FIG. 4A is a profile cross-sectional view of a wirebonded protrusion 400 in accordance with various examples. The wirebonded protrusion 400 includes a bottom portion 402 and a top portion 404. The top portion 404 includes a fold crease 406 and a tapered portion, or tail, 408. In examples, the tapered portion 408 and the bottom portion 402 share a common vertical plane. The fold crease 406 is formed by folding one segment of a bond wire atop another segment of bond wire, as described below. The description of materials, bond wire gauge, and pitch provided above for the wirebonded protrusion 300 also applies to the wirebonded protrusion 400.

Figure 4B:
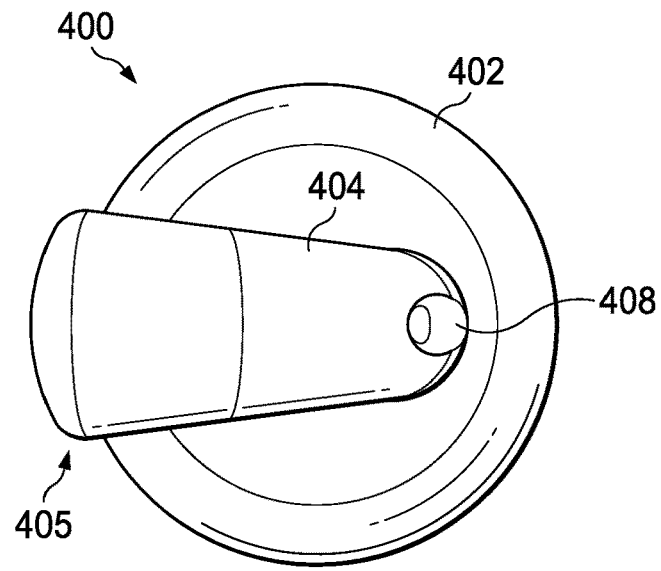
Figure 4C:
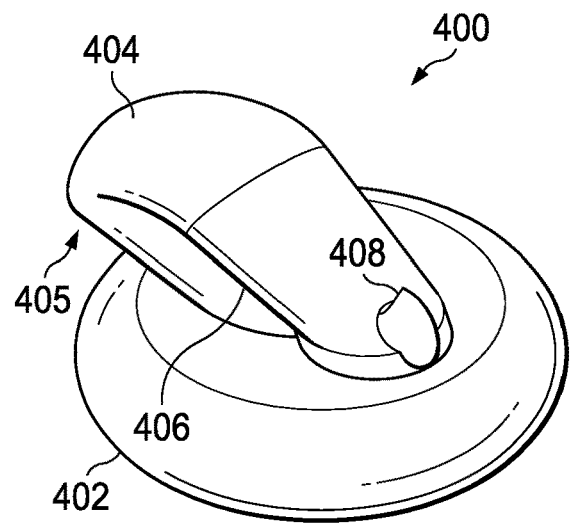

FIG. 4B is a top-down view of the wirebonded protrusion 400, in accordance with various examples. FIG. 4C is a perspective view of the wirebonded protrusion 400, in accordance with various examples.

Figure 4D:
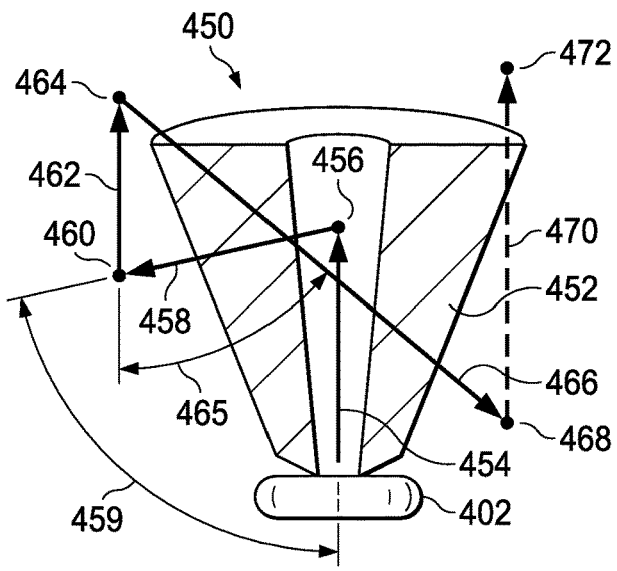
FIG. 4D is a diagram of a wirebonding capillary movement pattern in accordance with various examples.
Figure 4E:
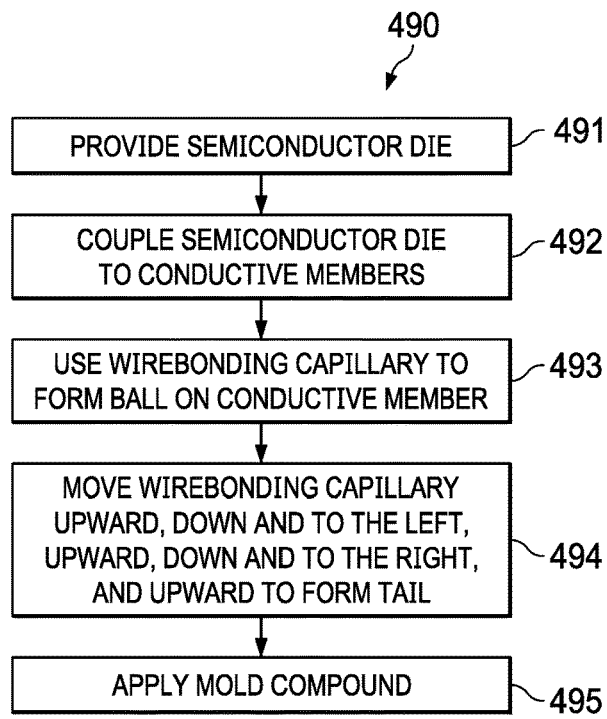
FIG. 4E is a flow diagram of a method for manufacturing a semiconductor package including a wirebonded protrusion coupled to a conductive member, in accordance with various examples.

FIG. 4D is a diagram of a wirebonding capillary movement pattern 450 in accordance with various examples. FIG. 4E is a flow diagram of a method 490 for manufacturing a semiconductor package including the wirebonded protrusion 400, in accordance with various examples. FIGS. 4D and 4E are now described in parallel. The method 490 begins with providing a semiconductor die (491) and coupling the semiconductor die to conductive members (492). The method 490 includes using a wirebonding capillary 452 to form the bottom portion 402, such as a ball bond (493). The bottom portion 402 may be formed using an EFO technique, for example. The method 490 includes moving the wirebonding capillary 452 upward (494). FIG. 4D shows upward movement 454 to a point 456. The total distance of the upward movement 454 determines the length of the folded region shown in wirebonded protrusion 400 and determines the length of fold crease 406. The method 490 includes moving the wirebonding capillary 452 downward and to the left, as movement 458 shows (494). In examples, the movement 458 is at an angle 459 relative to the movement 454. The angle 459 ranges from 15 to 75 degrees, with an angle outside this range being disadvantageous because they would fail to generate a bend to form the fold. The angle 459 determines the height of 405, which is described below. The movement 458 terminates at point 460. The total distance of the movement 458 determines the length of the upward arc formed (405) and influences the height of 405. The method 490 includes moving the wirebonding capillary 452 upward along a movement 462 to a point 464 (494). The total distance of the movement 462 determines the downward arc. Both 458 and 462 determines the total length of the arc formed in the fold. The method 490 includes moving the wirebonding capillary 452 downward and to the right, as movement 466 shows, to a point 468 (494). The movement 466 is at an angle 465 relative to the movement 462. The angle 465 ranges from 15 to 75 degrees, with an angle outside this range being disadvantageous because the resulting fold would produce a structure where the wire is too long and extends beyond the bottom portion 402 or too short and does not arrive at the bottom portion 402. The angle 465 determines the location of the landing on the bottom portion 402. The total distance of the movement 466 determines the length of the fold after the arc and should equal to or be larger than movement 454. The method 490 includes an upward movement of the wirebonding capillary 452 to form the tapered portion 408 (494), as movement 470 shows. The movement 470 extends to point 472. The total distance of the movement 470 determines the height of the tapered portion 408. The wire clamp is closed after 470. The movements 454, 462, and 470 are at a normal angle relative to the surface on which the bottom portion 402 is formed. The method 490 includes applying a mold compound (495). The steps 493 and 494 may be performed at any time in the method 490, as long as the surface on which the wirebonded protrusion 400 is to be formed is accessible to the wirebonding capillary 452 without obstruction.

The maximum height of the top portion 404 ranges from the wire height to 2.5 times the wire height. The length of the top portion 404 is four times the wire diameter. Heights and lengths outside this range are disadvantageous as there is a risk of touching the die surface during movement 458. In examples, such as that shown in FIG. 4A, one end of the top portion 404 extends horizontally beyond a corresponding end of the bottom portion 402, as numeral 405 indicates. The length by which the end of the top portion 404 extends horizontally beyond the corresponding end of the bottom portion 402 ranges from 1.5 times to 2.5 times wire diameter, with a length outside this range being disadvantageous because of risk to damaging the die with a large bottom portion 402, and the risk of a weak bond with a small bottom portion 402.

Figure 5A:
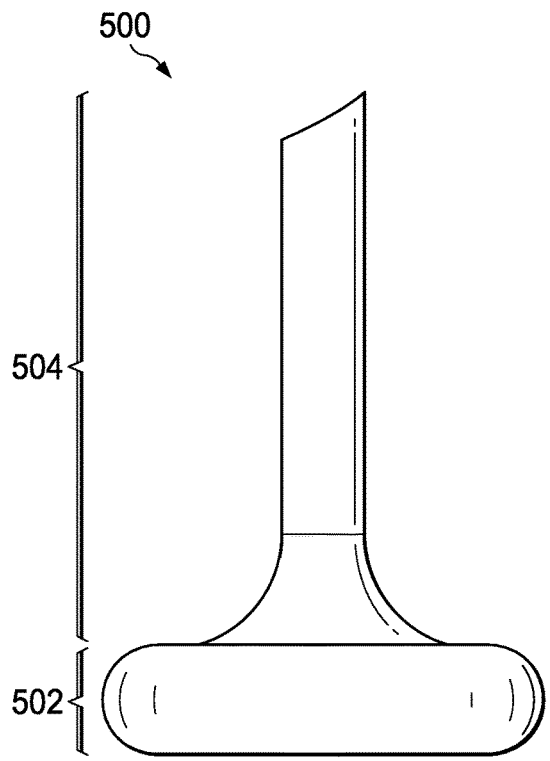
FIGS. 5A-5C are profile cross-sectional, top-down, and perspective views of a wirebonded protrusion coupled to a conductive member, in accordance with various examples.

FIG. 5A is a profile cross-sectional view of a wirebonded protrusion 500 having a rod shape, in accordance with various examples. The wirebonded protrusion 500 includes a bottom portion 502 and a top portion 504. The top portion 504 includes a tapered portion, or tail, at its distal end. In examples, the tapered portion and the bottom portion 502 share a common vertical plane. A rod shape is any shape that is generally cylindrical, with a horizontal cross-section of the cylinder being circular, ovoid, rectangular, irregular, or any other suitable two-dimensional shape. The description of materials, bond wire gauge, and pitch provided above for the wirebonded protrusion 300 also applies to the wirebonded protrusion 500.

Figure 5B:
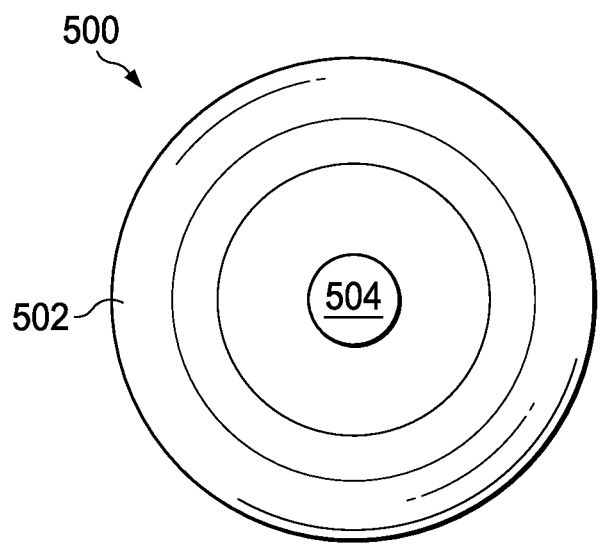
Figure 5C:
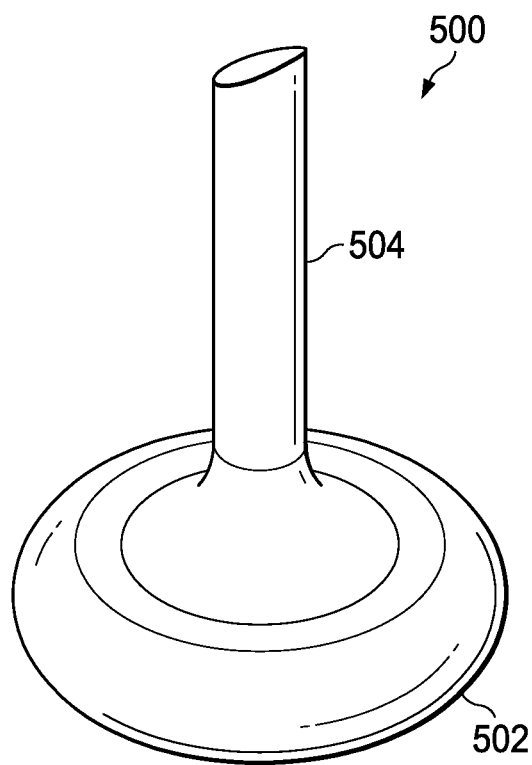

FIG. 5B is a top-down view of the wirebonded protrusion 500, in accordance with various examples. FIG. 5C is a perspective view of the wirebonded protrusion 500, in accordance with various examples.

Figure 5D:
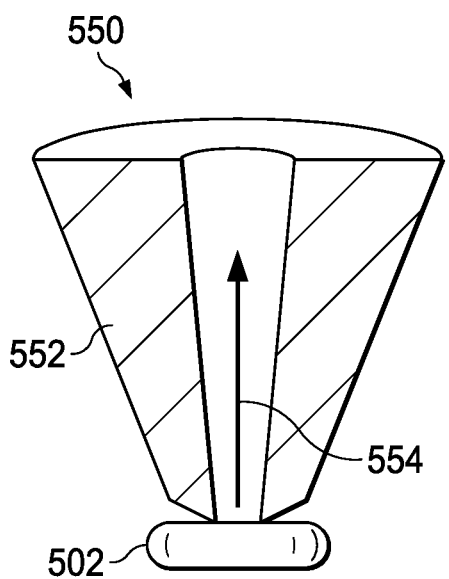
FIG. 5D is a diagram of a wirebonding capillary movement pattern in accordance with various examples.
Figure 5E:
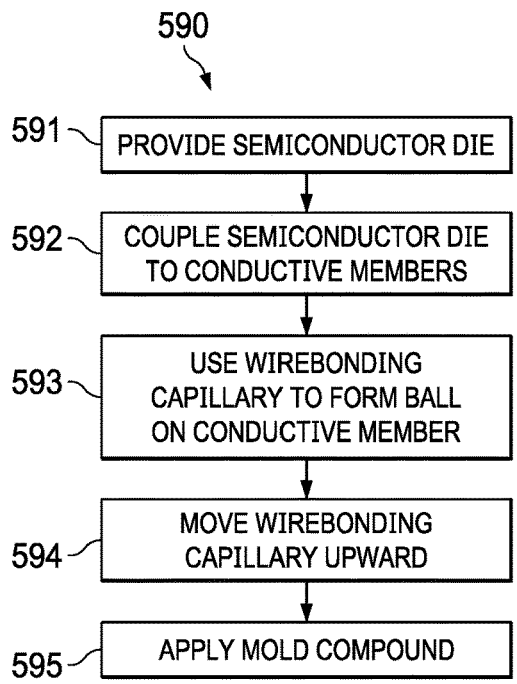
FIG. 5E is a flow diagram of a method for manufacturing a semiconductor package including a wirebonded protrusion coupled to a conductive member, in accordance with various examples.

FIG. 5D is a diagram of a wirebonding capillary movement pattern 550 in accordance with various examples. FIG. 5E is a flow diagram of a method 590 for manufacturing a semiconductor package including the wirebonded protrusion 500, in accordance with various examples. FIGS. 5D and 5E are now described in parallel. The method 590 includes providing a semiconductor die (591) and coupling the semiconductor die to one or more conductive members (592). The method 590 includes using a wirebonding capillary 552 to form the bottom portion 502 on a conductive member (593). For example, the wirebonding capillary 552 may employ an EFO technique to form a ball that is then used together with ultrasound, a normal force, and heat to form a ball bond such as the bottom portion 502, as described above. The method 590 includes moving the wirebonding capillary 552 upward (594), as upward movement 554 shows. The upward movement 554 continues until the target length of the top portion 504 has been achieved, and then the wire clamp is closed and ultrasound is applied to cut the tail to form the distal tapered portion of the top portion 504. The total distance of the upward movement 554 determines the total length of the top portion 504. The total length of the top portion 504 ranges from the wire diameter to the distance to the mold cap, with a total length outside this range being disadvantageous because extending beyond the mold cap would bend the tail during the mold process. The upward movement 554 is at a normal angle relative to the surface on which the bottom portion 502 is formed. The method 590 includes applying a mold compound (595). The steps 593 and 594 may be performed at any time in the method 590, as long as the surface on which the wirebonded protrusion 500 is to be formed is accessible to the wirebonding capillary 552 without obstruction.

Figure 6A:
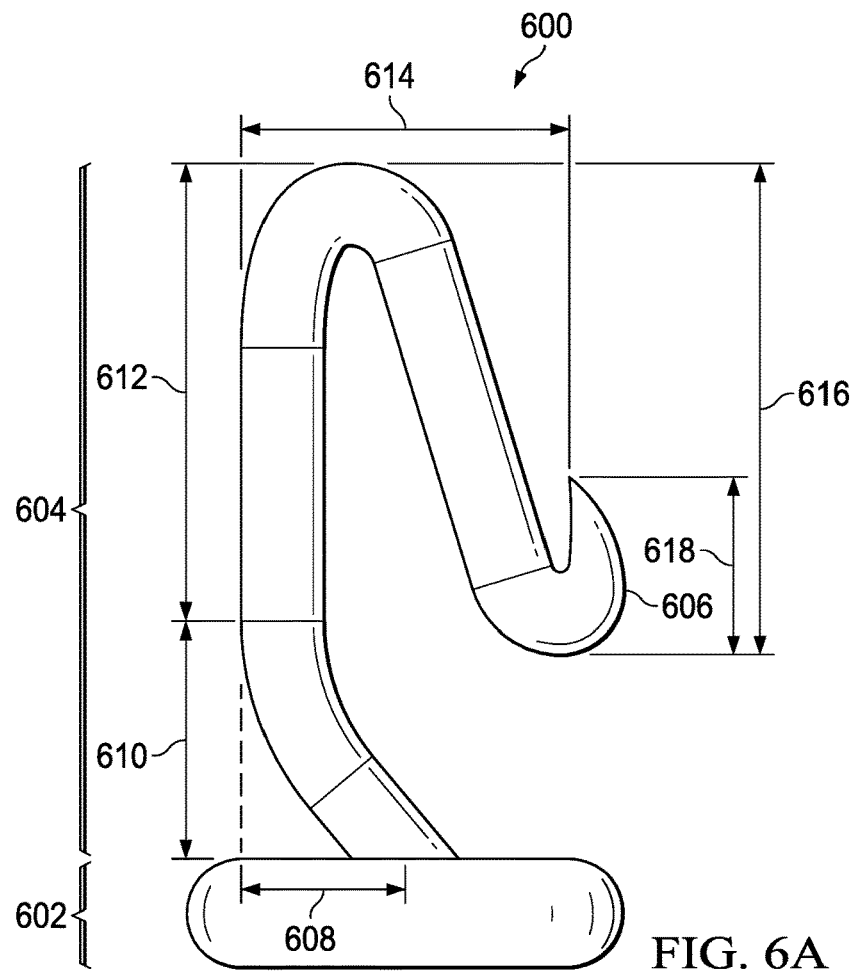
FIGS. 6A-6C are profile cross-sectional, top-down, and perspective views of a wirebonded protrusion coupled to a conductive member, in accordance with various examples.

FIG. 6A is a profile cross-sectional view of a wirebonded protrusion 600 in accordance with various examples. The wirebonded protrusion 600 includes a bottom portion 602 and a top portion 604. The top portion 604 includes a tapered portion, or tail, 606. In examples, the tapered portion 606 and the bottom portion 602 share a common vertical plane. The wirebonded protrusion 600 is representative of a hook shape, although shapes different from that shown in FIG. 6A also may qualify as hook shapes. A hook shape in the context of a wirebonded protrusion is a shape that meets the general definition of a hook, meaning that it is a bent or curved structure for retaining, holding, or suspending something. In the context of a wirebonded protrusion, a hook is particularly suited for retaining a mold compound, die attach layer, or other material, the delamination of which is to be prevented. The top portion 604 includes a kink offset 608 and a kink height 610, a hook height 612, a hook factor length 614 and a hook factor height 616, and a tail height 618. The kink offset 608 ranges from the wire diameter to three wire diameters, with a kink offset outside this range being disadvantageous because adjacent locations cannot be populated with wire The kink height 610 ranges from the wire diameter to five wire diameters, with a kink height outside this range being disadvantageous because the hook segment would not be over the bottom portion 602 and would be unstable. The hook height 612 ranges from the wire diameter to the distance to the mold cap, with a hook height outside this range being disadvantageous because the mold cap would bend the hook. The hook factor length 614 ranges from two times the wire diameter to three times the wire diameter, with a hook factor length outside this range being disadvantageous because this would prevent adjacent areas from being populated by the structure. The hook factor height 616 ranges from twice the wire diameter to four times the wire diameter, with a hook factor height outside this range being disadvantageous because a fold will be formed instead of a hook. The tail height 618 ranges from the wire diameter to twice the wire diameter, with a tail height outside this range being disadvantageous because it will cause the hook to sag. The description of materials, bond wire gauge, and pitch provided above for the wirebonded protrusion 300 also applies to the wirebonded protrusion 600.

Figure 6B:
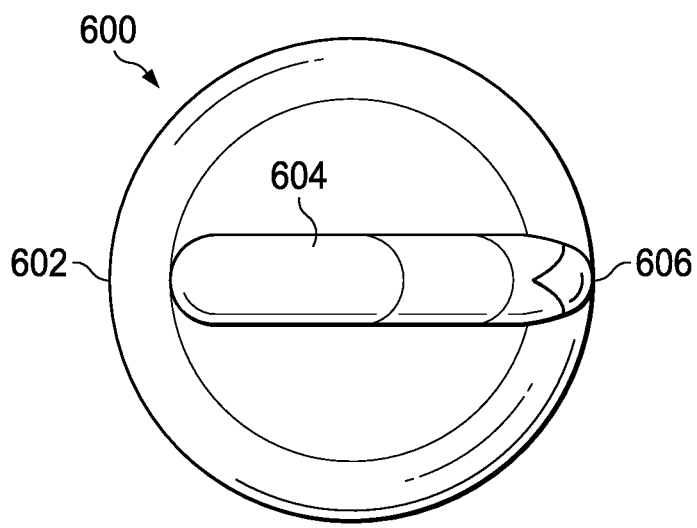
Figure 6C:
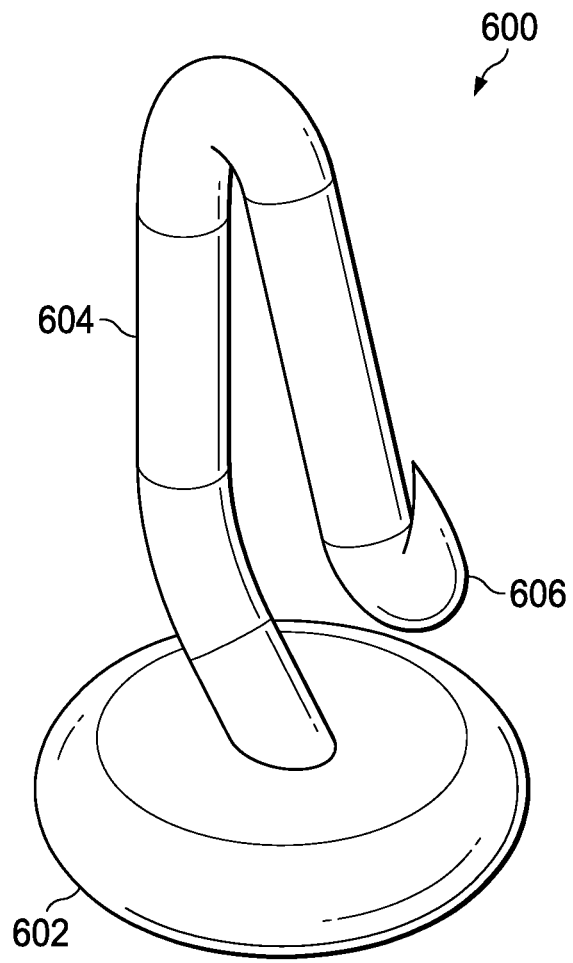

FIG. 6B is a top-down view of the wirebonded protrusion 600, in accordance with various examples. FIG. 6C is a perspective view of the wirebonded protrusion 600, in accordance with various examples.

Figure 6D:
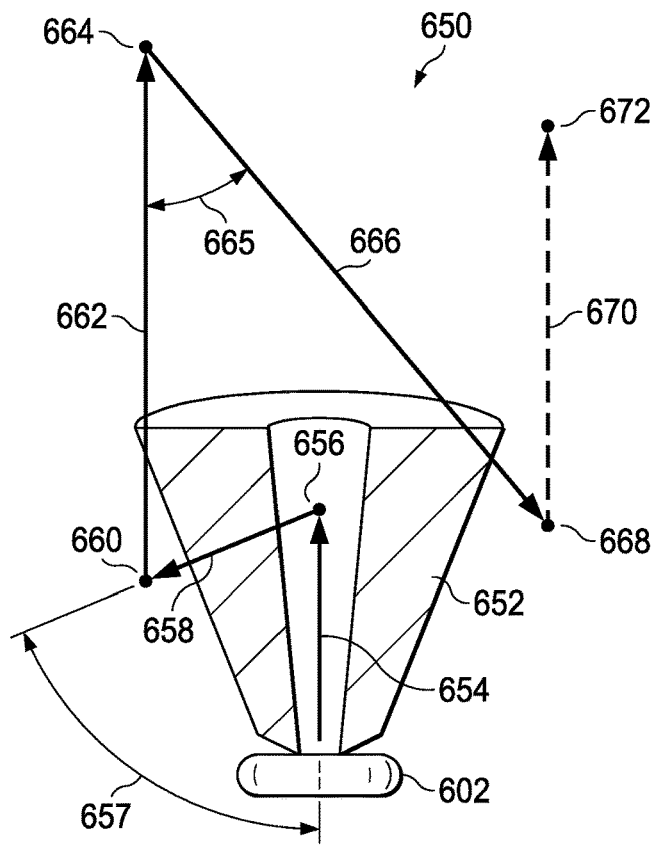
FIG. 6D is a diagram of a wirebonding capillary movement pattern in accordance with various examples.
Figure 6E:
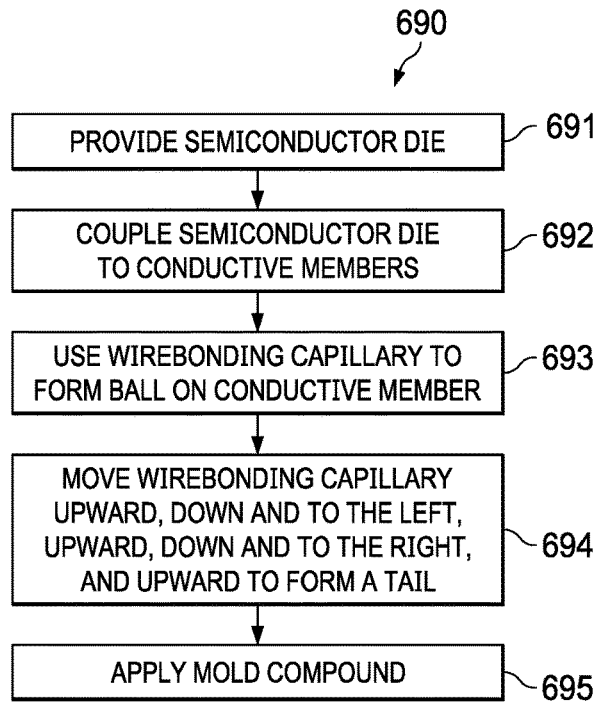
FIG. 6E is a flow diagram of a method for manufacturing a semiconductor package including a wirebonded protrusion coupled to a conductive member, in accordance with various examples.

FIG. 6D is a diagram of a wirebonding capillary movement pattern 650 in accordance with various examples. FIG. 6E is a flow diagram of a method 690 for manufacturing a semiconductor package including the wirebonded protrusion 600, in accordance with various examples. FIGS. 6D and 6E are now described in parallel. The method 690 begins with providing a semiconductor die (691) and coupling the semiconductor die to one or more conductive members (692). The method 690 includes using a wirebonding capillary 652 to form the bottom portion 602 on a conductive member (693), for example, using an EFO technique in combination with ultrasound, a normal force, and heat, as described above. The method 690 includes moving the wirebonding capillary 652 upward (694), as upward movement 654 depicts. The upward movement 654 terminates at point 656. The total distance of the upward movement 654 determines the kink height 610. The method 690 includes moving the wirebonding capillary 652 down and to the left, as movement 658 shows. The movement 658 terminates at point 660. Movement 658 occurs at an angle 657 relative to upward movement 654. The total distance of movement 658 determines the kink offset 608. The angle 657 ranges from 15 to 75 degrees, with an angle outside this range being disadvantageous because a kink would not form. The angle 657 determines the kink angle. The method 690 includes moving the wirebonding capillary 652 upward, as upward movement 662 shows. The upward movement 662 terminates at point 664. The total distance of the upward movement 662 determines the hook height 612. The method 690 includes moving the wirebonding capillary 652 downward and to the right, as movement 666 shows. The movement 666 terminates at point 668. Movement 666 occurs at an angle 665 relative to upward movement 662. The angle 665 ranges from 15 to 75 degrees, with angle outside this range being disadvantageous because the fold in the hook would not form. The angle 665 determines the angle of the hook. The total distance of the movement 666 determines the hook factor length 614 and hook factor height 616. The method 690 includes moving the wirebonding capillary 652 upward to form a tail (694), as upward movement 670 shows. Upward movement 670 terminates at point 672. The total distance of the upward movement 670 determines the tail height 618. The upward movements 654, 662, and 670 are at a normal angle relative to the surface on which the bottom portion 602 is formed. The method 690 includes applying a mold compound (695). The steps 693 and 694 may be performed at any time in the method 690, as long as the surface on which the wirebonded protrusion 600 is to be formed is accessible by the wirebonding capillary 652 without obstruction.

Figure 7A:
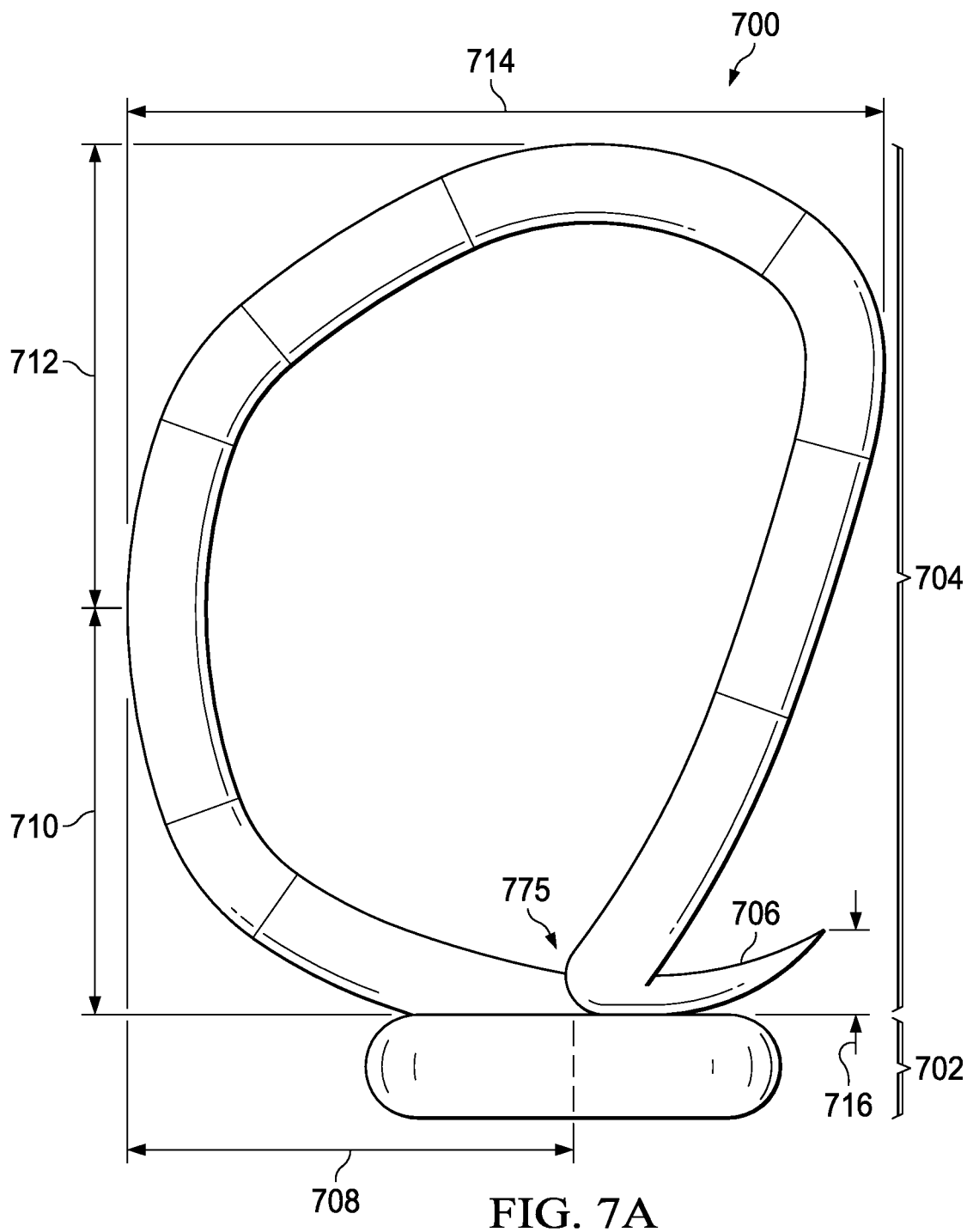
FIGS. 7A-7C are profile cross-sectional, top-down, and perspective views of a wirebonded protrusion coupled to a conductive member, in accordance with various examples.

FIG. 7A is a profile cross-sectional view of a wirebonded protrusion 700, in accordance with various examples. The wirebonded protrusion 700 includes a bottom portion 702 and a top portion 704. The top portion 704 includes a tapered portion, or tail, 706. In examples, the tapered portion 706 and the bottom portion 702 share a common vertical plane. The top portion 704 includes a kink offset 708, a kink height 710, a loop height 712, a loop width 714, and a tail height 716. The kink offset 708 ranges from three times the wire diameter to eight times the wire diameter, with a kink offset outside this range being disadvantageous because larger values would generate loops of unacceptably low density and smaller values would not generate a loop at all. The kink height 710 ranges from the wire diameter to five wire diameter lengths, with a kink height outside this range being disadvantageous because the loop would not be over the bottom portion 702 and would be unstable. The loop height 712 ranges from the wire diameter to the distance to the mold cap, with a loop height outside this range being disadvantageous because the mold cap would bend the loop during the molding process. The loop width 714 ranges from four times the wire diameter to sixteen times the wire diameter, with a loop width outside this range being disadvantageous because it would prelude adjacent locations from being populated with the structure. The tail height 716 ranges from the wire diameter to the distance to the mold cap minus twice the wire diameter, with a tail height outside this range being disadvantageous because a fold will be formed instead of a loop. The wirebonded protrusion 700 has a loop shape, meaning that it has two ends that contact each other; that it has two ends that contact a common structure, such as the bottom portion 702; or that it has two points along a length that contact each other. A loop may be a circle, an oval, an irregular shape as shown in FIG. 7A, or any other suitable shape. The description of materials, bond wire gauge, and pitch provided above for the wirebonded protrusion 300 also applies to the wirebonded protrusion 700.

Figure 7B:
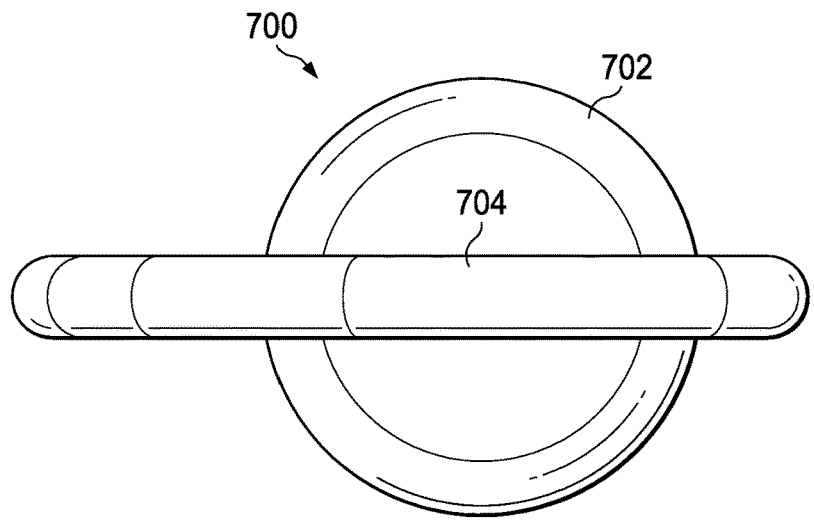
Figure 7C:
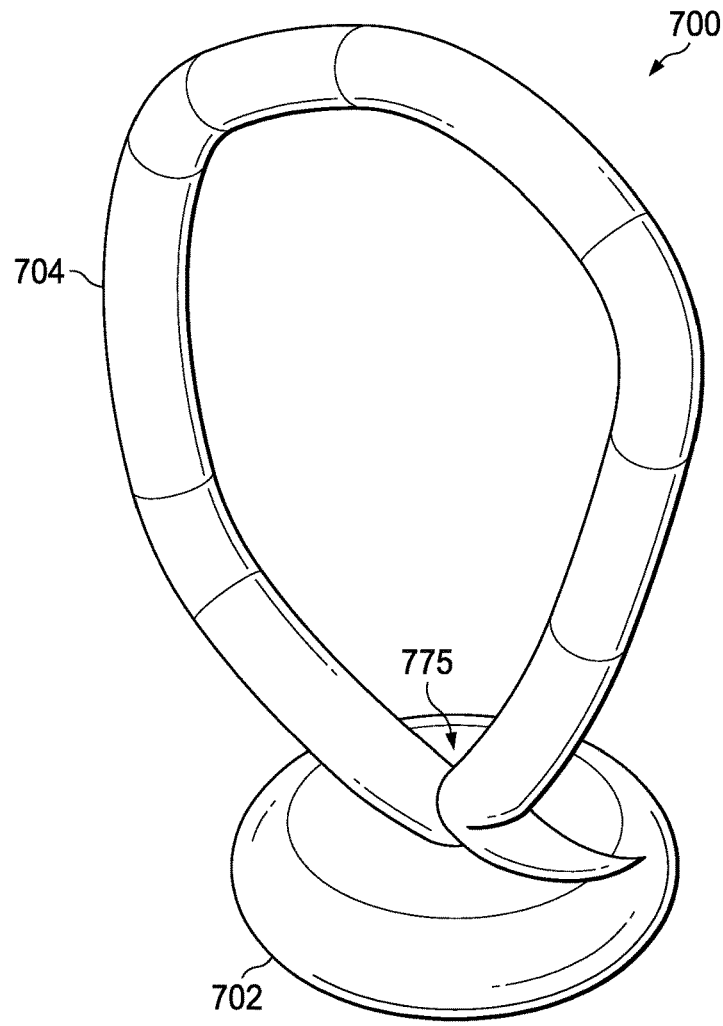

FIG. 7B is a top-down view of the wirebonded protrusion 700, in accordance with various examples. FIG. 7C is a perspective view of the wirebonded protrusion 700, in accordance with various examples.

Figure 7D:
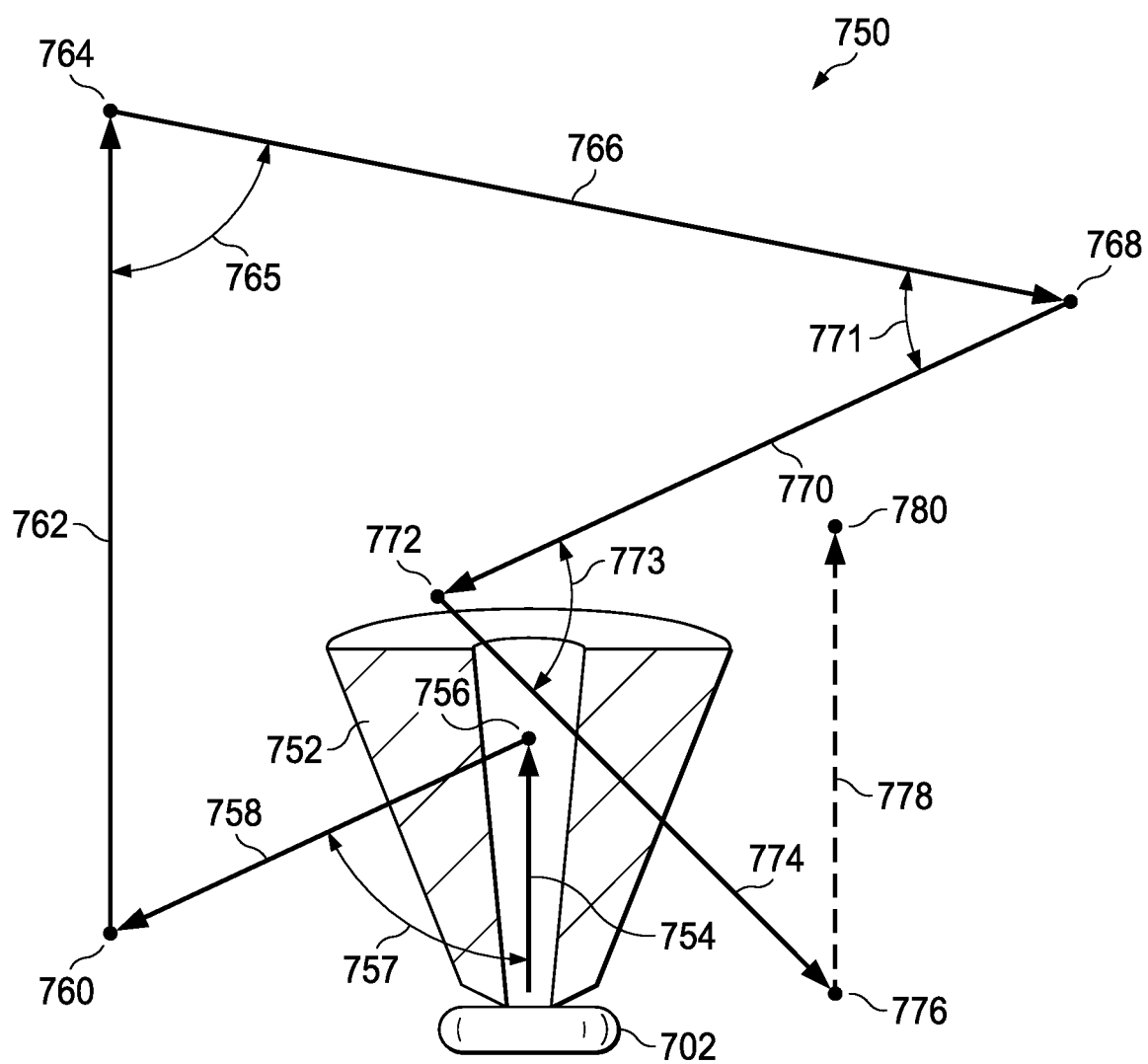
FIG. 7D is a diagram of a wirebonding capillary movement pattern in accordance with various examples.
Figure 7E:
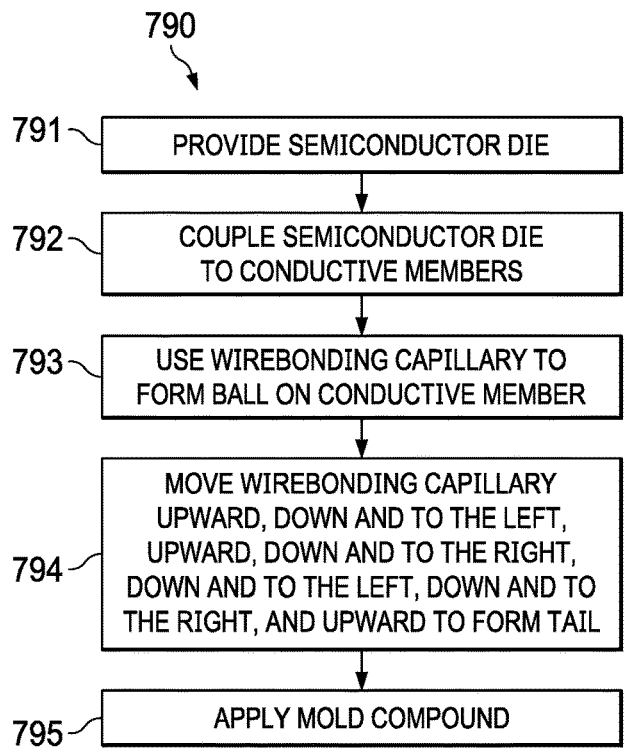
FIG. 7E is a flow diagram of a method for manufacturing a semiconductor package including a wirebonded protrusion coupled to a conductive member, in accordance with various examples.

FIG. 7D is a diagram of a wirebonding capillary movement pattern 750 in accordance with various examples. FIG. 7E is a flow diagram of a method 790 for manufacturing a semiconductor package including the wirebonded protrusion 700, in accordance with various examples. FIGS. 7D and 7E are now described in parallel. The method 790 begins with providing a semiconductor die (791) and coupling the semiconductor die to one or more conductive members (792). The method 790 includes using a wirebonding capillary 752 to form the bottom portion 702 on a conductive member, for example, by forming a ball using an EFO technique and subsequently using ultrasound, a normal force, and heat to form a ball bond (793). The method 790 includes moving the wirebonding capillary 752 upward, as upward movement 754 shows. The upward movement 754 terminates at point 756. The total distance of the upward movement 754 determines the kink height 710. The method 790 includes moving the wirebonding capillary 752 down and to the left, as movement 758 shows. The movement 758 terminates at point 760. The movement 758 is at an angle 757 relative to upward movement 754. The angle 757 ranges from 15 to 75 degrees, with angles outside this range being disadvantageous because the kink would not be formed. The angle 757 determines the kink angle. The total distance of the movement 758 determines the kink offset 708.

The method 790 includes moving the wirebonding capillary 752 upward, as upward movement 762 shows. The upward movement 762 terminates at point 764. The total distance of the upward movement 762 determines the loop height 712. The method 790 includes moving the wirebonding capillary 752 down and to the right, as movement 766 shows. Movement 766 terminates at point 768. The movement 766 is at an angle 765 relative to the upward movement 762. Angle 765 ranges from 15 to 75 degrees, with an angle outside this range being disadvantageous because the loop would not be formed. The angle 765 determines the curvature within the loop. The total distance of the movement 766 determines the loop width 714. The method 790 includes moving the wirebonding capillary 752 down and to the left, as movement 770 shows. The movement 770 terminates at point 772. The movement 770 is at an angle 771 relative to the movement 766. The angle 771 ranges from 15 to 75 degrees, with an angle outside this range being disadvantageous because the loop will not be formed. The angle 771 determines the downward trajectory of the loop. The total distance of the movement 770 determines the point at which the loop of the top portion 704 terminates (e.g., point 775 in FIG. 7A). The method 790 includes moving the wirebonding capillary 752 down and to the right, as movement 774 shows. The movement 774 terminates at point 776. The movement 774 is at an angle 773 relative to movement 770. The angle 773 ranges from 15 to 75 degrees, with an angle outside this range being disadvantageous because it will not permit loop formation. The angle 773 forms the last portion of the loop. The total distance of the movement 774 determines the location of the return. The method 790 includes moving the wirebonding capillary 752 upward to form the tapered portion, or tail, 706. The upward movement 778 terminates at point 780. The total distance of the upward movement 778 determines the tail height 716. The upward movements 754, 762, and 778 are at a normal angle relative to the surface on which the bottom portion 702 is formed. The method 790 includes applying a mold compound (795). The steps 793 and 794 may be performed at any time in the method 790, as long as the surface on which the wirebonded protrusion 700 is to be formed is accessible by the wirebonding capillary 752 without obstruction.

Figure 8:
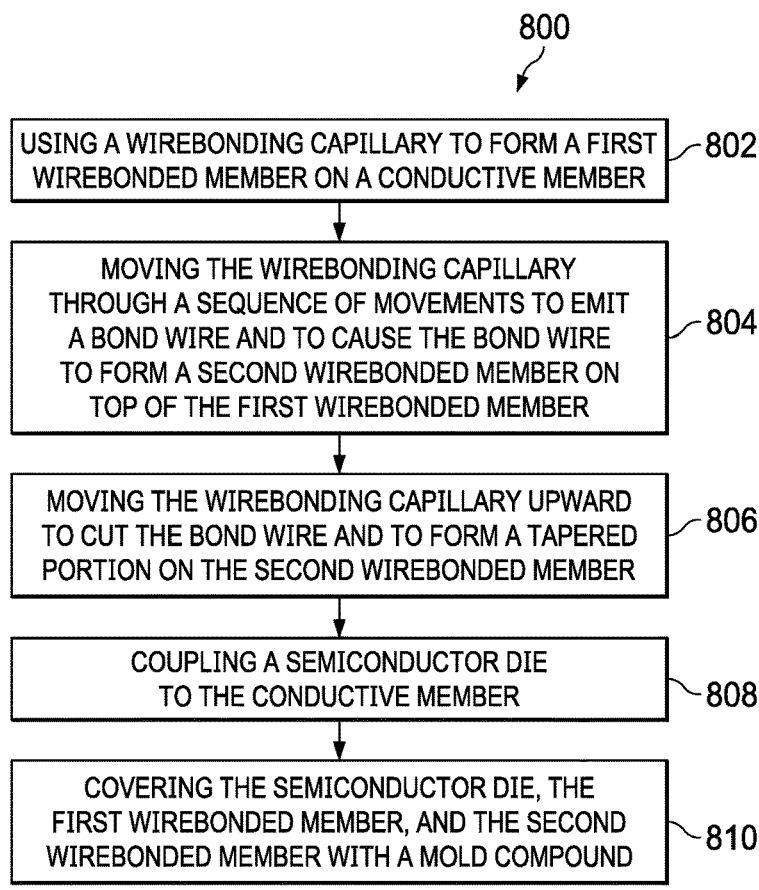
FIG. 8 is a flow diagram of a method for forming semiconductor packages having wirebonded protrusions coupled to conductive members, in accordance with various examples.

FIG. 8 is a flow diagram of a method 800 for forming semiconductor packages having wirebonded protrusions coupled to conductive members, in accordance with various examples. The method 800 is more generic than the specific methods described above with reference to FIGS. 3E, 4E, 5E, 6E, and 7E. The method 800 includes using a wirebonding capillary to form a first wirebonded member on a conductive member (802). The method 800 includes moving the wirebonding capillary through a sequence of movements to emit a bond wire and to cause the bond wire to form a second wirebonded member on top of the first wirebonded member (804). The method 800 includes moving the wirebonding capillary upward to cut the bond wire and to form a tapered portion on the second wirebonded member (806). The method 800 includes coupling a semiconductor die to the conductive member (808). The method 800 includes covering the semiconductor die, the first wirebonded member, and the second wirebonded member with a mold compound (810).

Figures 9A, 9B:
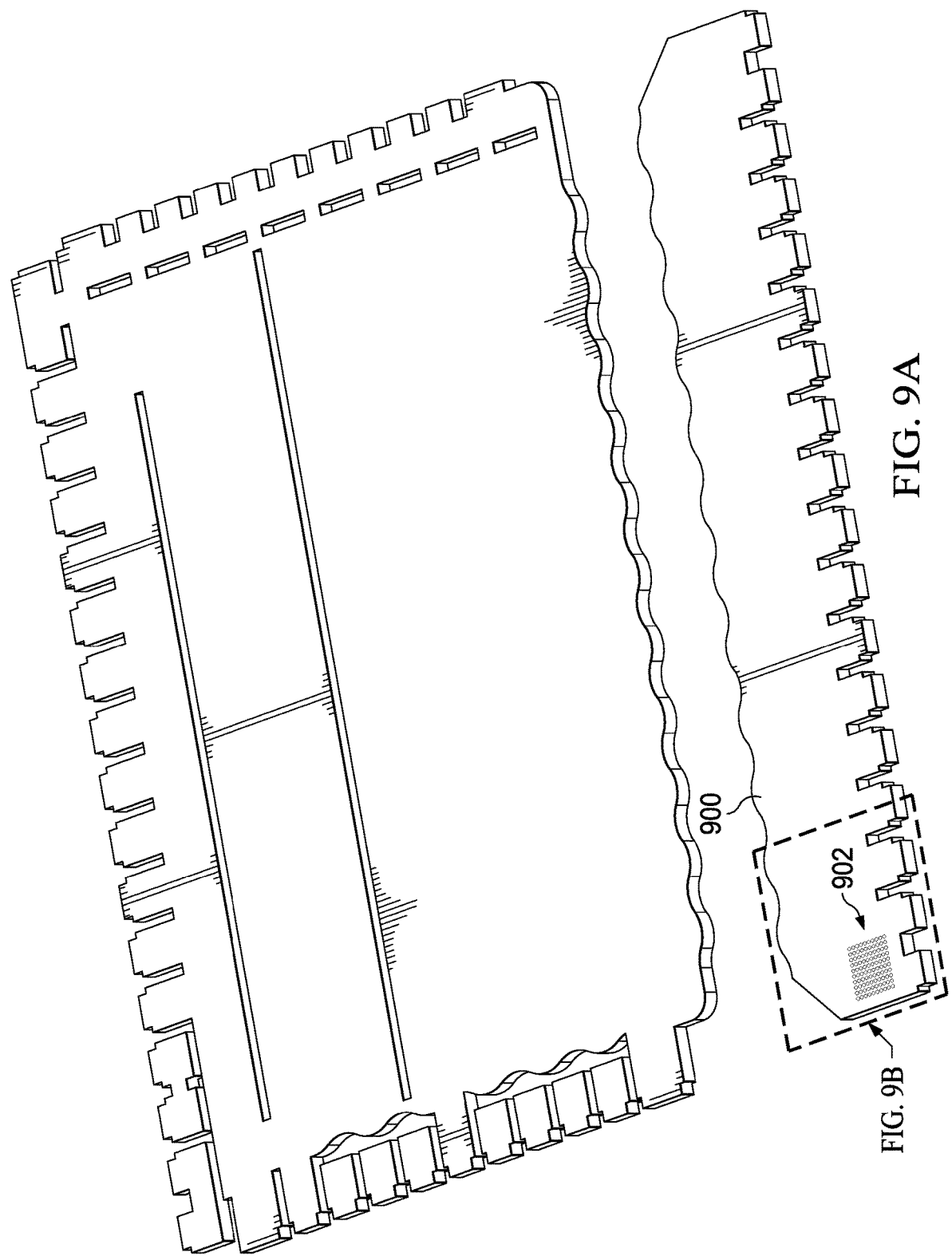
FIGS. 9A-9D are perspective views of conductive members having sets of wirebonded protrusions formed thereon, in accordance with various examples.
Figures 9B, 9C:
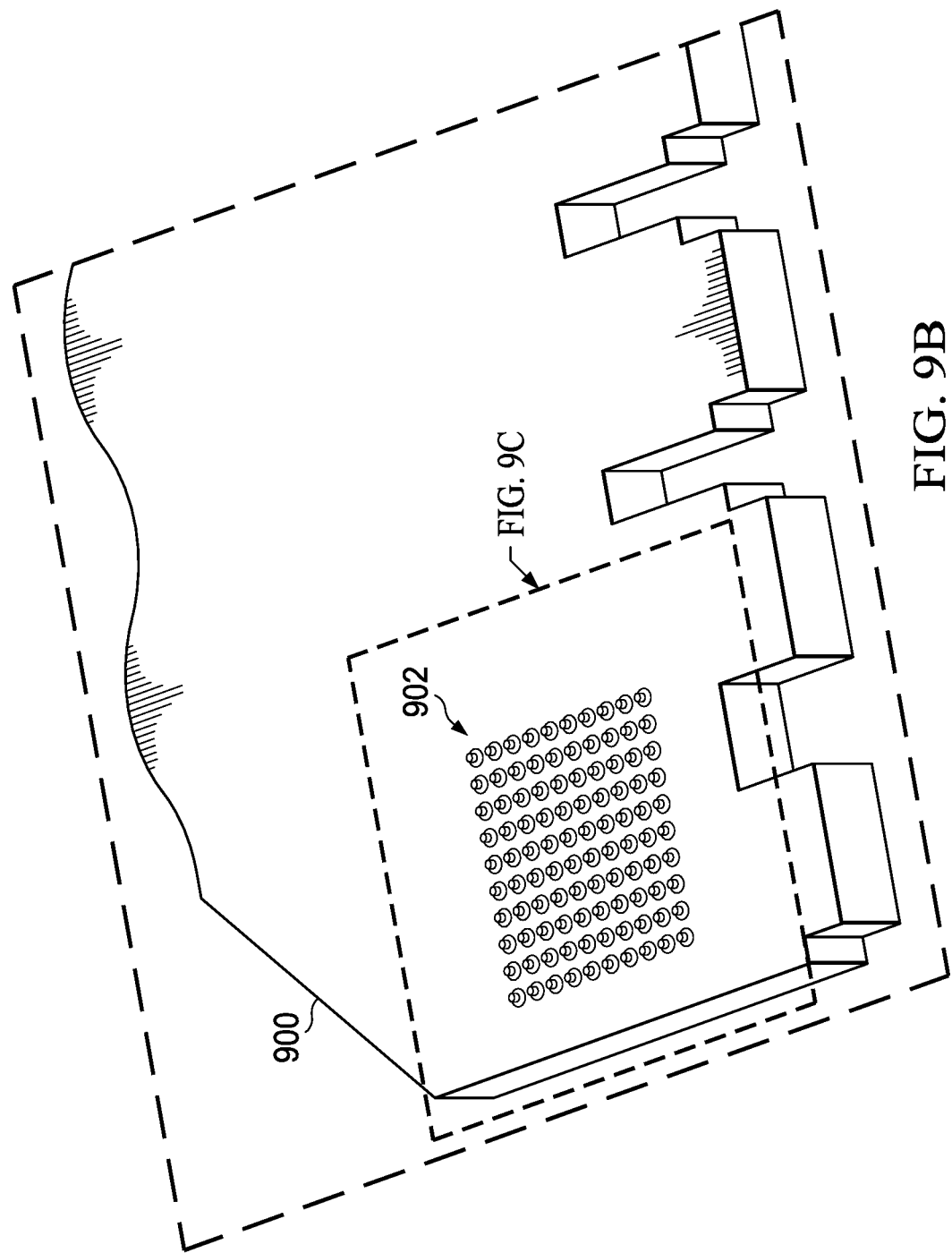
Figure 9D:
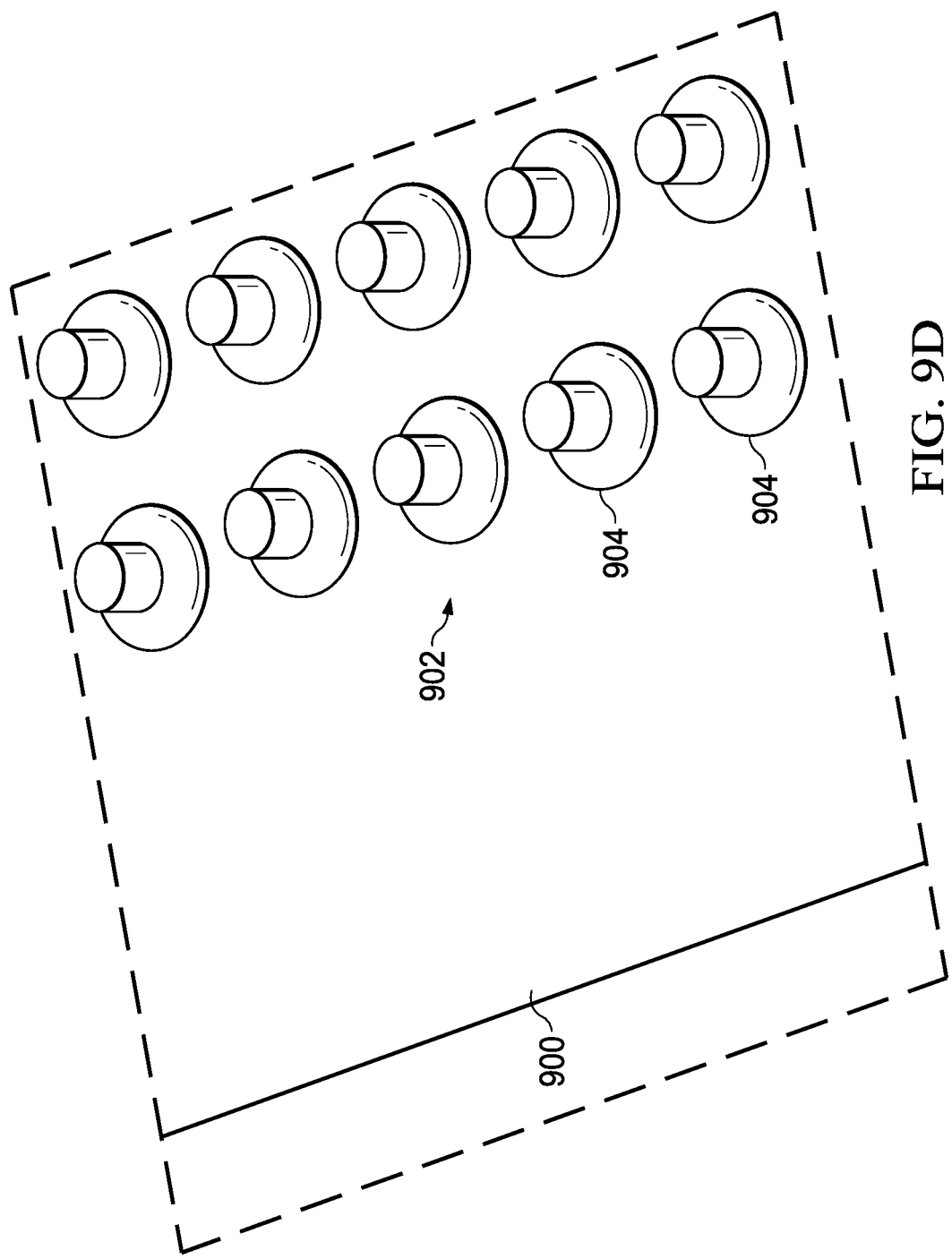

FIGS. 9A-9D are perspective views of conductive members having sets of wirebonded protrusions formed thereon, in accordance with various examples. The views provided in FIGS. 9A-9D are of conductive members and wirebonded protrusions, without the other components that may be included in a semiconductor package. FIG. 9A shows a conductive member 900 including a set of wirebonded protrusions 902 formed on the conductive member 900. The wirebonded protrusions in the set of wirebonded protrusions 902 may be any of the wirebonded protrusions described above, or they may be different types of wirebonded protrusions, or they may be a combination of a variety of wirebond protrusion types. The set of wirebonded protrusions 902 may be of uniform shape and size, or the wirebonded protrusions may be of differing shapes, sizes, or shapes and sizes. Although one set of wirebonded protrusions 902 is shown in FIG. 9A, the conductive member 900 may include any number of sets of wirebonded protrusions 902. In some examples, some or all sets of wirebonded protrusions 902 may be uniform, and in other examples, some or all sets of wirebonded protrusions 902 may differ in shape, sizes, or shapes and sizes. FIGS. 9B, 9C, and 9D show successively closer views of the set of wirebonded protrusions 902. FIGS. 9C and 9D depict wirebonded protrusions 904 within the set of wirebonded protrusions 902. In examples, the wirebonded protrusions 904 include ball bonds that are electrically coupled to each other but that do not physically abut each other. In examples, none of the wirebonded protrusions 904 establishes direct physical contact with a semiconductor die.

Figure 10:
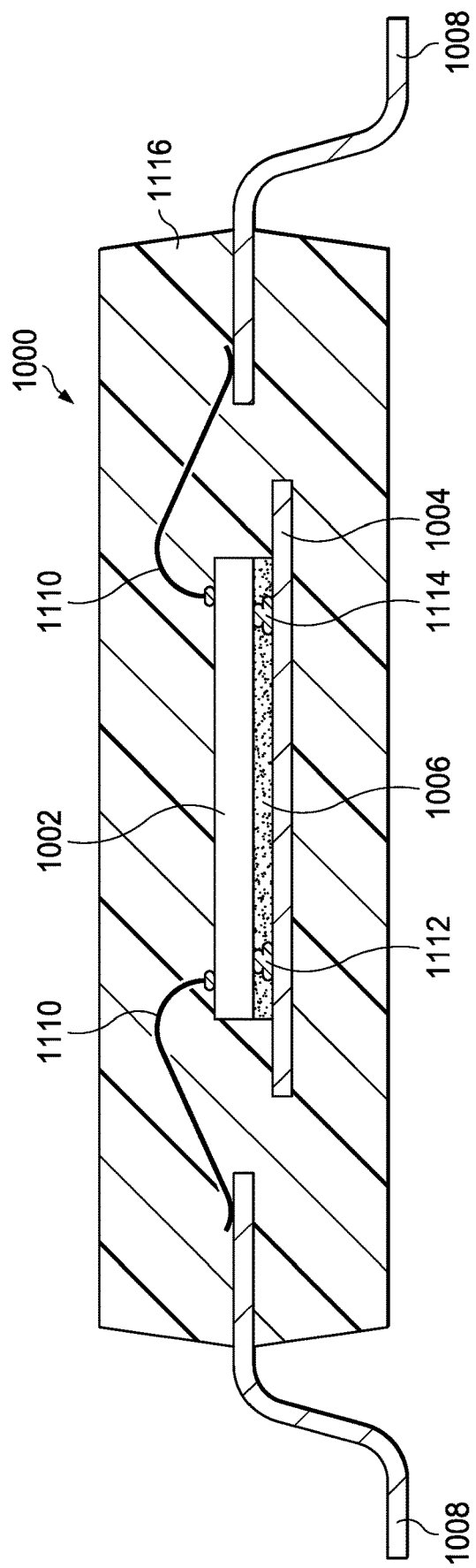
FIG. 10 is a profile cross-sectional view of a semiconductor package having wirebonded protrusions abutting a die attach layer, in accordance with various examples.

As described above, wirebonded protrusions are useful to mitigate delamination risk for mold compounds. However, wirebonded protrusions are also useful to mitigate delamination risk for other materials, such as die attach layers. FIG. 10 is a profile cross-sectional view of a semiconductor package 1000 having wirebonded protrusions abutting a die attach layer, in accordance with various examples. Specifically, the semiconductor package 1000 includes a semiconductor die 1002 coupled to a conductive member 1004 (e.g., a die pad) by way of a die attach layer 1006. Conductive members 1008 (e.g., leads) are exposed to an exterior of the semiconductor package 1000. Bond wires 1110 couple a device side of the semiconductor die 1002 to the conductive members 1008. The semiconductor package 1000 includes wirebonded protrusions 1112 and 1114, such as those described above, on the conductive member 1004 and abutting the die attach layer 1006 instead of the mold compound 1116. In this way, the wirebonded protrusions 1112 and 1114 increase the surface area to which the die attach layer 1006 bonds, thereby mitigating delamination risk. Further, the wirebonded protrusions 1112 and 1114 may have certain shapes that further mitigate the delamination risk, for example, the various shapes (e.g., hooks, loops) described above.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. Unless otherwise stated, "about," "approximately," or "substantially" preceding a value means +/−10 percent of the stated value. Modifications are possible in the described examples, and other examples are possible within the scope of the claims.

What is claimed is:

1. A semiconductor package, comprising:
a semiconductor die;
a conductive member coupled to the semiconductor die;
a wirebonded protrusion coupled to the conductive member, a physical structure of the wirebonded protrusion determined at least in part by a sequence of movements of a wirebonding capillary used to form the wirebonded protrusion, the wirebonded protrusion including a ball bond and a bond wire, the bond wire having a proximal end coupled to the ball bond, the bond wire having a distal end; and
a mold compound covering the semiconductor die, the conductive member, and the wirebonded protrusion, wherein the distal end is in a common vertical plane with the ball bond and is not connected to a structure other than the mold compound.

2. The semiconductor package of claim 1, wherein the wirebonded protrusion includes a bond wire having a gauge, and wherein a second wirebonded protrusion coupled to the conductive member is positioned at a distance from the wirebonded protrusion that is at least three times the gauge.

3. The semiconductor package of claim 1, further comprising a wirebond having a first end that is coupled to a device side of the semiconductor die and a second end that is coupled to the conductive member, and wherein the conductive member is a lead of the semiconductor package that is exposed to an exterior of the semiconductor package.

4. The semiconductor package of claim 1, wherein the wirebonded protrusion includes a hook abutting the mold compound.

5. The semiconductor package of claim 1, wherein the wirebonded protrusion includes a loop abutting the mold compound.

6. The semiconductor package of claim 1, further including a die attach layer abutting the wirebonded protrusion.

7. The semiconductor package of claim 1, wherein the wirebonded protrusion is not positioned on a device side of the semiconductor die.

8. The semiconductor package of claim 1, wherein the wirebonded protrusion is formed of a material that is different than a material on the conductive member that the wirebonded protrusion abuts.

9. A semiconductor package, comprising:
a semiconductor die;
a conductive member coupled to the semiconductor die;
a first wirebonded protrusion coupled to the conductive member, the first wirebonded protrusion formed of a first ball bond and a first bond wire having a wire gauge, the first bond wire having a first proximal end coupled to the first ball bond, the first bond wire having a first distal end;
a second wirebonded protrusion coupled to the conductive member, the second wirebonded protrusion formed of a second ball bond and a second bond wire having the wire gauge, the second bond wire having a second proximal end coupled to the second ball bond, the second bond wire having a second distal end, a pitch between the first and second wirebonded protrusions at least three times the wire gauge; and
a mold compound covering the semiconductor die, the conductive member, and the first and second wirebonded protrusions,
wherein the first distal end is in a common first vertical plane with the first ball bond and is not connected to a structure other than the mold compound, and wherein the second distal end is in a common second vertical plane with the second ball bond and is not connected to a structure other than the mold compound.

10. The semiconductor package of claim 9, wherein the first wirebonded protrusion includes a hook abutting the mold compound.

11. The semiconductor package of claim 9, wherein the first wirebonded protrusion includes a loop abutting the mold compound.

12. The semiconductor package of claim 9, wherein the semiconductor package includes a die attach layer abutting the first wirebonded protrusion.

13. The semiconductor package of claim 9, further comprising a wirebond having a first end that is coupled to a device side of the semiconductor die and a second end that is coupled to the conductive member, and wherein the conductive member is a lead of the semiconductor package that is exposed to an exterior of the semiconductor package.

14. The semiconductor package of claim 9, wherein the first wirebonded protrusion is coupled to a first surface of the conductive member, and further comprising a third wirebonded protrusion coupled to a second surface of the conductive member, the second surface opposing the first surface.

15. A method, comprising:
  using a wirebonding capillary to form a first wirebonded member on a conductive member;
  moving the wirebonding capillary through a sequence of movements to emit a bond wire and to cause the bond wire to form a second wirebonded member on top of the first wirebonded member, the second wirebonded member including a proximal end coupled to the first wirebonded member;
  moving the wirebonding capillary upward to cut the bond wire and to form a distal end of the second wirebonded member, the distal end sharing a common vertical plane with the first wirebonded member;
  coupling a semiconductor die to the conductive member; and
  covering the semiconductor die, the first wirebonded member, and the second wirebonded member with a mold compound,
  wherein the distal end does not abut a structure other than the mold compound.

16. The method of claim 15, further comprising forming a third wirebonded member on the conductive member at a distance from the first wirebonded member that is at least three times a gauge of bond wire of which the first, second, and third wirebonded members are composed.

17. The method of claim 15, further comprising moving the wirebonding capillary so the second wirebonded member includes a loop, the loop abutting the mold compound.

18. The method of claim 15, further comprising moving the wirebonding capillary so the second wirebonded member includes a hook, the hook abutting the mold compound.

19. The method of claim 15, wherein the first and second wirebonded members are formed of a material that differs from that used to plate the conductive member.

20. The method of claim 15, wherein the first and second wirebonded members abut a die attach layer.

21. A semiconductor package, comprising:
  a die pad;
  a semiconductor die coupled to the die pad by way of a die attach layer;
  a conductive member at least partially inside the semiconductor package and exposed to an exterior of the semiconductor package;
  a wirebond having a first ball bond on a device side of the semiconductor die and a first bond wire, the first bond wire having a first proximal end coupled to the first ball bond, the first bond wire having a distal end coupled to the conductive member;
  a first wirebonded protrusion coupled to the conductive member, the first wirebonded protrusion including a second ball bond and a second bond wire, the second bond wire having a second proximal end coupled to the second ball bond, the second bond wire having a second distal end in vertical alignment with the second ball bond;
  a second wirebonded protrusion coupled to the die pad, the second wirebonded protrusion including a third ball bond and a third bond wire, the third bond wire having a third proximal end coupled to the third ball bond, the third bond wire having a third distal end in vertical alignment with the third ball bond; and
  a mold compound covering the die pad, the semiconductor die, the conductive member, the wirebond, the first wirebonded protrusion, and the second wirebonded protrusion,
  wherein each of the second and third distal ends abuts only the mold compound.

* * * * *